US007437527B2

(12) United States Patent
Davis et al.

(10) Patent No.: US 7,437,527 B2
(45) Date of Patent: Oct. 14, 2008

(54) MEMORY DEVICE WITH DELAYED ISSUANCE OF INTERNAL WRITE COMMAND

(75) Inventors: Paul G. Davis, San Jose, CA (US); Frederick A. Ware, Los Altos Hills, CA (US); Craig E. Hampel, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/733,167

(22) Filed: Apr. 9, 2007

(65) Prior Publication Data

US 2007/0177436 A1 Aug. 2, 2007

Related U.S. Application Data

(63) Continuation of application No. 11/181,412, filed on Jul. 13, 2005, which is a continuation of application No. 11/090,343, filed on Mar. 24, 2005, now Pat. No. 7,047,375, which is a continuation of application No. 10/014,457, filed on Dec. 11, 2001, now Pat. No. 6,889,300, which is a continuation of application No. 09/169,736, filed on Oct. 9, 1998, now Pat. No. 6,343,352.

(60) Provisional application No. 60/061,503, filed on Oct. 10, 1997.

(51) Int. Cl.
*G06F 12/00* (2006.01)

(52) U.S. Cl. .................. 711/167; 365/230.01; 365/201

(58) Field of Classification Search .................. 711/167, 711/168, 169, 154, 105, 106, 100, 5; 365/201, 365/233, 189, 230.01, 230.03; 327/158, 327/297, 298, 299
See application file for complete search history.

(56) References Cited

U.S. PATENT DOCUMENTS 3,950,735 A 4/1976 Patel ........................ 340/172.5

(Continued)

FOREIGN PATENT DOCUMENTS

EP 0339224 A2 11/1989

(Continued)

OTHER PUBLICATIONS

Haining, T. R. et al., "Management Policies For Non-Volatile Write Caches", International Conference on Performance, Computing, and Communications, Feb. 10-12, 1999 pp. 321-328.*

(Continued)

*Primary Examiner*—Pierre-Michel Bataille
(74) *Attorney, Agent, or Firm*—Morgan, Lewis & Bockius LLP

(57) ABSTRACT

A method and apparatus for storing data in a memory device is described. The apparatus is configured to perform the following steps. The method employs a two-step technique which allows the out-of-order completion of read and write operations. When a write operation requires a resource needed for the completion of a read operation, the data being written is stored in a write data buffer in the memory device. The write data is stored in the buffer until a datapath is available to communicate the data to the memory device's memory core. Once the resource is free (or the memory device, or its controller force the write to complete) the data is written to the memory core of the memory device using the now-free datapath.

29 Claims, 20 Drawing Sheets

U.S. PATENT DOCUMENTS

| | | | | |
|---|---|---|---|---|
| 4,183,095 A | 1/1980 | Ward | | 365/189 |
| 4,315,308 A | 2/1982 | Jackson | | 364/200 |
| 4,330,852 A | 5/1982 | Redwine et al. | | 365/221 |
| 4,337,523 A | 6/1982 | Hotta et al. | | 365/194 |
| 4,445,204 A | 4/1984 | Nishiguchi | | 365/194 |
| 4,499,536 A | 2/1985 | Gemma et al. | | 364/200 |
| 4,528,661 A | 7/1985 | Bahr et al. | | 370/86 |
| 4,637,018 A | 1/1987 | Flora et al. | | 371/1 |
| 4,646,270 A | 2/1987 | Voss | | 365/230 |
| 4,712,190 A | 12/1987 | Guglielmi et al. | | 364/900 |
| 4,719,602 A | 1/1988 | Hag et al. | | 365/230 |
| 4,755,937 A | 7/1988 | Glier | | 364/200 |
| 4,763,249 A | 8/1988 | Bomba et al. | | 364/200 |
| 4,792,926 A | 12/1988 | Roberts | | 365/189 |
| 4,792,929 A | 12/1988 | Olson et al. | | 365/233 |
| 4,799,199 A | 1/1989 | Scales, III et al. | | 365/230 |
| 4,800,530 A | 1/1989 | Itoh et al. | | 365/189 |
| 4,821,226 A | 4/1989 | Christopher et al. | | 364/900 |
| 4,825,411 A | 4/1989 | Hamano | | 365/189 |
| 4,845,664 A | 7/1989 | Aichelmann, Jr. et al. | | 364/900 |
| 4,845,677 A | 7/1989 | Chappell et al. | | 365/189.02 |
| 4,849,937 A | 7/1989 | Yoshimoto | | 365/189.05 |
| 4,866,675 A | 9/1989 | Kawashima | | 365/194 |
| 4,875,192 A | 10/1989 | Matsumoto | | 365/193 |
| 4,882,712 A | 11/1989 | Ohno et al. | | 365/206 |
| 4,891,791 A | 1/1990 | Iijima | | 365/189.01 |
| 4,916,670 A | 4/1990 | Suzuki et al. | | 365/233 |
| 4,920,483 A | 4/1990 | Pogue et al. | | 364/200 |
| 4,928,265 A | 5/1990 | Higuchi et al. | | 365/189.01 |
| 4,937,734 A | 6/1990 | Bechtolsheim | | 364/200 |
| 4,945,516 A | 7/1990 | Kashiyama | | 365/189.05 |
| 4,953,128 A | 8/1990 | Kawai et al. | | 395/472 |
| 5,001,672 A | 3/1991 | Ebbers et al. | | 365/230.05 |
| 5,022,004 A | 6/1991 | Kurtze et al. | | 710/107 |
| 5,077,693 A | 12/1991 | Hardee et al. | | 365/230.08 |
| 5,083,296 A | 1/1992 | Hara et al. | | 365/230.02 |
| 5,111,386 A | 5/1992 | Fujishima et al. | | 395/425 |
| 5,124,589 A | 6/1992 | Shiomi et al. | | 307/465 |
| 5,140,688 A | 8/1992 | White et al. | | 395/550 |
| 5,179,687 A | 1/1993 | Hidaka et al. | | 395/425 |
| 5,260,905 A | 11/1993 | Mori | | 365/230.05 |
| 5,276,858 A | 1/1994 | Oak et al. | | 395/550 |
| 5,301,278 A | 4/1994 | Bowater et al. | | 395/275 |
| 5,305,278 A | 4/1994 | Inoue | | 365/230.05 |
| 5,311,483 A | 5/1994 | Takasugi | | 365/233 |
| 5,319,755 A | 6/1994 | Farmwald et al. | | 710/104 |
| 5,323,358 A | 6/1994 | Toda et al. | | 365/230.09 |
| 5,327,390 A | 7/1994 | Takasugi | | 365/230 |
| 5,337,285 A | 8/1994 | Ware et al. | | 365/227 |
| 5,339,276 A | 8/1994 | Takasugi | | 365/230.02 |
| 5,341,341 A | 8/1994 | Fukuzo | | 365/253 |
| 5,345,573 A | 9/1994 | Bowden, III et al. | | 395/400 |
| 5,365,489 A | 11/1994 | Jeong | | 365/230.05 |
| 5,375,089 A | 12/1994 | Lo | | 365/189.04 |
| 5,381,376 A | 1/1995 | Kim et al. | | 365/230.05 |
| 5,381,538 A | 1/1995 | Amini et al. | | 395/425 |
| 5,384,745 A | 1/1995 | Konishi et al. | | 365/230.03 |
| 5,386,385 A | 1/1995 | Stephens, Jr. | | 365/189.05 |
| 5,388,222 A | 2/1995 | Chisvin et al. | | 711/154 |
| 5,388,250 A | 2/1995 | Lewis et al. | | 710/58 |
| 5,390,149 A | 2/1995 | Vogley et al. | | 365/189.01 |
| 5,392,239 A | 2/1995 | Margulis et al. | | 365/189.01 |
| 5,404,338 A | 4/1995 | Murai et al. | | 365/233 |
| 5,404,463 A | 4/1995 | McGarvey | | 395/325 |
| 5,432,468 A | 7/1995 | Moriyama et al. | | 327/152 |
| 5,444,667 A | 8/1995 | Obara | | 365/233 |
| 5,452,401 A | 9/1995 | Lin | | 395/750 |
| 5,455,803 A | 10/1995 | Kodama | | 365/233 |
| 5,471,607 A | 11/1995 | Garde | | 395/550 |
| 5,483,640 A | 1/1996 | Isfeld et al. | | 395/200.03 |
| 5,508,960 A | 4/1996 | Pinkham | | 365/189.01 |
| 5,511,024 A | 4/1996 | Ware et al. | | 365/189.04 |
| 5,533,204 A | 7/1996 | Tipley | | 395/288 |
| 5,548,786 A | 8/1996 | Amini et al. | | 395/842 |
| 5,553,248 A | 9/1996 | Melo et al. | | 395/296 |
| 5,588,130 A | 12/1996 | Fujishima et al. | | 711/118 |
| 5,594,704 A | 1/1997 | Konishi et al. | | 365/233 |
| 5,598,376 A | 1/1997 | Merritt et al. | | 365/230.06 |
| 5,611,058 A | 3/1997 | Moore et al. | | 395/309 |
| 5,613,075 A | 3/1997 | Wade et al. | | 365/189.07 |
| 5,623,607 A | 4/1997 | Kodama et al. | | 710/29 |
| 5,638,531 A | 6/1997 | Crump et al. | | 395/450 |
| 5,649,161 A | 7/1997 | Andrade et al. | | 395/494 |
| 5,655,113 A | 8/1997 | Leung et al. | | 395/552 |
| 5,659,515 A | 8/1997 | Matsuo et al. | | 365/222 |
| 5,673,226 A | 9/1997 | Yumitori et al. | | 365/190 |
| 5,680,361 A | 10/1997 | Ware et al. | | 365/230.01 |
| 5,708,622 A | 1/1998 | Ohtani et al. | | 365/233 |
| 5,715,407 A | 2/1998 | Barth et al. | | 395/290 |
| 5,740,398 A | 4/1998 | Quattromani et al. | | 711/117 |
| 5,748,914 A | 5/1998 | Barth et al. | | 395/285 |
| 5,758,132 A | 5/1998 | Stråhlin | | 395/556 |
| 5,764,963 A | 6/1998 | Ware et al. | | 395/507 |
| 5,765,020 A | 6/1998 | Barth et al. | | 395/823 |
| 5,774,409 A | 6/1998 | Yamazaki et al. | | 365/230.03 |
| 5,777,942 A | 7/1998 | Dosaka | | 365/189.05 |
| 5,778,419 A | 7/1998 | Hansen et al. | | 711/112 |
| 5,781,918 A | 7/1998 | Lieberman et al. | | 711/5 |
| 5,793,227 A | 8/1998 | Goldrian | | 326/94 |
| 5,796,995 A | 8/1998 | Nasserbakht et al. | | 395/558 |
| 5,802,356 A | 9/1998 | Gaskins et al. | | 395/555 |
| 5,802,555 A | 9/1998 | Shigeeda | | 711/106 |
| 5,805,873 A | 9/1998 | Roy | | 395/557 |
| 5,815,693 A | 9/1998 | McDermott et al. | | 395/556 |
| 5,828,606 A | 10/1998 | Mick | | 365/189.5 |
| 5,844,855 A | 12/1998 | Ware et al. | | 365/230.01 |
| 5,870,350 A | 2/1999 | Bertin et al. | | 365/233 |
| 5,872,996 A | 2/1999 | Barth et al. | | 395/853 |
| 5,884,100 A | 3/1999 | Normoyle et al. | | 395/872 |
| 5,886,948 A | 3/1999 | Ryan | | 365/233 |
| 5,896,545 A | 4/1999 | Barth et al. | | 395/824 |
| 5,917,760 A | 6/1999 | Millar | | 365/194 |
| 5,918,058 A | 6/1999 | Budd | | 395/750.01 |
| 5,940,340 A | 8/1999 | Ware et al. | | 365/230.01 |
| 5,956,284 A | 9/1999 | Ware et al. | | 365/230.01 |
| 5,970,019 A | 10/1999 | Suzuki et al. | | 365/230.06 |
| 5,978,296 A | 11/1999 | Zibert | | 365/222 |
| 5,987,620 A | 11/1999 | Tran | | 713/600 |
| 6,006,290 A | 12/1999 | Suh | | 710/35 |
| 6,021,264 A | 2/2000 | Morita | | 395/297 |
| 6,035,369 A | 3/2000 | Ware et al. | | 711/105 |
| 6,065,092 A | 5/2000 | Roy | | 711/5 |
| 6,075,730 A | 6/2000 | Barth et al. | | 365/191 |
| 6,125,078 A * | 9/2000 | Ooishi et al. | | 365/233 |
| 6,134,638 A | 10/2000 | Olarig et al. | | 711/167 |
| 6,182,207 B1 | 1/2001 | Poivre et al. | | 712/215 |
| 6,185,151 B1 | 2/2001 | Cho | | 365/233 |
| 6,209,071 B1 | 3/2001 | Barth et al. | | 711/167 |
| 6,226,723 B1 | 5/2001 | Gustavson et al. | | 711/170 |
| 6,256,716 B1 | 7/2001 | Pham | | 711/167 |
| 6,260,097 B1 | 7/2001 | Farmwald et al. | | 710/129 |
| 6,263,448 B1 | 7/2001 | Tsern et al. | | 713/501 |
| 6,266,285 B1 | 7/2001 | Farmwald et al. | | 365/194 |
| 6,266,737 B1 | 7/2001 | Ware et al. | | 711/105 |
| 6,279,077 B1 | 8/2001 | Nasserbakht et al. | | 711/118 |
| 6,304,937 B1 | 10/2001 | Farmwald et al. | | 710/129 |
| 6,314,051 B1 | 11/2001 | Farmwald et al. | | 365/233 |
| 6,321,316 B1 | 11/2001 | Manning | | 711/167 |
| 6,343,352 B1 | 1/2002 | Davis et al. | | 711/158 |
| 6,401,167 B1 | 6/2002 | Barth et al. | | 711/106 |
| 6,404,178 B2 * | 6/2002 | Kato | | 323/316 |
| 6,437,619 B2 * | 8/2002 | Okuda et al. | | 327/158 |
| 6,442,644 B1 | 8/2002 | Gustavson et al. | | 711/105 |
| 6,462,998 B1 * | 10/2002 | Proebsting | | 365/201 |

| | | | | |
|---|---|---|---|---|
| 6,463,066 B2 | 10/2002 | Moriwaki et al. | | 711/117 |
| 6,470,405 B2 | 10/2002 | Barth et al. | | 710/100 |
| 6,493,789 B2 | 12/2002 | Ware et al. | | 711/105 |
| 6,496,897 B2 | 12/2002 | Ware et al. | | 711/105 |
| 6,526,462 B1 | 2/2003 | Elabd | | 710/242 |
| 6,560,652 B1 | 5/2003 | Larson et al. | | 709/232 |
| 6,584,037 B2 | 6/2003 | Farmwald et al. | | 365/233 |
| 6,591,353 B1 | 7/2003 | Barth et al. | | 711/167 |
| 6,658,578 B1 | 12/2003 | Laurenti et al. | | 713/324 |
| 6,677,791 B2 * | 1/2004 | Okuda et al. | | 327/158 |
| 6,681,288 B2 | 1/2004 | Griffin et al. | | 711/105 |
| 6,701,446 B2 | 3/2004 | Tsern et al. | | 713/501 |
| 6,868,474 B2 | 3/2005 | Barth et al. | | 711/104 |
| 6,889,300 B2 | 5/2005 | Davis et al. | | 711/169 |
| 6,931,467 B2 | 8/2005 | Barth et al. | | 710/100 |
| 7,047,375 B2 | 5/2006 | Davis et al. | | 711/158 |
| 7,197,611 B2 | 3/2007 | Barth et al. | | 711/154 |
| 7,287,119 B2 | 10/2007 | Barth et al. | | 711/105 |
| 2007/0147143 A1 | 6/2007 | Barth et al. | | 365/194 |
| 2007/0198868 A1 | 8/2007 | Barth et al. | | 713/401 |

FOREIGN PATENT DOCUMENTS

| | | | |
|---|---|---|---|
| EP | 0487819 | A2 | 6/1992 |
| EP | 0535670 | A1 | 4/1993 |
| EP | 0561370 | A2 | 9/1993 |
| EP | 0638858 | A1 | 2/1995 |
| EP | 0778575 | A2 | 6/1997 |
| FR | 2965227 | A1 | 3/1994 |
| JP | 58 192154 | A2 | 11/1983 |
| JP | 61-107453 | A2 | 5/1986 |
| JP | 61-160556 | A2 | 10/1986 |
| JP | 62-012689 | A2 | 1/1987 |
| JP | 63-034795 | A2 | 2/1988 |
| JP | 63-091766 | A2 | 4/1988 |
| JP | 63-217452 | A2 | 9/1988 |
| JP | 63-239676 | A2 | 10/1988 |
| JP | 01-236494 | A2 | 9/1989 |
| WO | WO 96/30838 | | 10/1996 |

OTHER PUBLICATIONS

Shiratake, S. et al, Pseudo Multi-Bank DRAM with Categorized Access Sequence, Symposium on VLSI Circuits, Jun. 17-19, 1999 pp. 127-130.*

Arimoto, K. et al., "A Circuit Design of Intelligent Cache Dram with Automatic Write-Back Capability," IEEE Journal of Solid-State Circuits, vol. 26, No. 4, Apr. 1991, pp. 560-565.

Gillingham, P., "SLDRAM Architectural and Functional Overview," SLDRAM Consortium, MOSAID Technologies Inc., pp. 1-14, Aug. 29, 1997.

Kristiansen, E. et al., "Scalable Coherent Interface," to appear in Eurobus Conference Proceedings, May 1989.

Kumanoy et al., "Trends in High-Speed DRAM Architecture," IEICE Trans Electron. vol. E 79-C, No. 4, Apr. 1996, pp. 472-481.

Ohno, C., "Self-Timed RAM: STRAM," Fujitsu Sci. Tech. J. 24, 4, pp. 293-300, Dec. 1988, 8 pages.

Przybyliski, S., "New DRAM Technologies, A Comprehensive Analysis of the New Architectures," pp. iii-iv, 119-121, 138-158, 177-203, MicroDesign Resource, 1994.

Mosys, Inc., "MD904 to MD920, ½ to 2 ½MByte Multibank DRAM (MDRAM) 128Kx32 to 656x32," Preliminary Information, Feb. 21, 1997.

Rambus Inc., "⁸⁄₉-Mbit (1Mx⁸⁄₉) & ¹⁶⁄₁₈Mbit (2Mx⁸⁄₉) RDRAM-Preliminary Information," Rambus Inc. Data Sheet, Mar. 1, 1996, 30 pages.

Rambus Inc., "¹⁶⁄₁₈Mbit (2Mx⁸⁄₉) & ⁶⁴⁄₇₂ MBit (8Mx⁸⁄₉) Concurrent RDRAM - Advance Information," Rambus Inc. Data Sheet, Jul. 1996, 61 pages.

Rambus Inc., "¹⁶⁄₁₈Mbit (2M⁸⁄₉) Concurrent RDRAM," Rambus Inc. Data Sheet, Mar. 1996, pp. 1-33.

Rambus Inc., "Architectural overview," Rambus Inc., 1992, pp. 1-24.

Texas Instruments, "TMS626402, 2097 152-Word By 4-Bit By 2-Bank Synchronous Dynamic Random-Access Memory," 1994, pp. 5-3-5-23.

* cited by examiner

MEMORY DEVICE WITH DELAYED ISSUANCE OF INTERNAL WRITE COMMAND

This application is a continuation of U.S. patent application Ser. No. 11/181,412, filed Jul. 13, 2005, which is a continuation of U.S. patent application Ser. No. 11/090,343, filed Mar. 24, 2005, now U.S. Pat. No. 7,047,375, which is a continuation of U.S. patent application Ser. No. 10/014,457, filed Dec. 11, 2001, now U.S. Pat. No. 6,889,300, which is a continuation of U.S. patent application Ser. No. 09/169,736, filed Oct. 9, 1998, now U.S. Pat. No. 6,343,352, which claims benefit of U.S. Provisional Patent Application Ser. No. 60/061,503, filed Oct. 10, 1997, which are incorporated herein by reference.

BACKGROUND OF THE INVENTION

1. Field of the Invention

The present invention relates to the transfer of data in digital systems. More specifically, the present invention relates to a protocol and apparatus that provide improved interconnect utilization. In particular, a two-step write operation according to the present invention avoids resource conflicts, thus permitting read and write operations to be issued in any order while maintaining continuous data traffic.

2. Description of the Related Art

A computer, such as a computer system 10 shown in FIG. 1A, typically includes a bus 12 which interconnects the system's major subsystems such as a central processing unit (CPU) 14, a main memory 16 (e.g., DRAM), an input/output (I/O) adapter 18, an external device such as a display screen 24 via a display adapter 26, a keyboard 32 and a mouse 34 via an I/O adapter 18, a SCSI host adapter 36, and a floppy disk drive 38 operative to receive a floppy disk 40. SCSI host adapter 36 may act as a storage interface to a fixed disk drive 42 or a CD-ROM player 44 operative to receive a CD-ROM 46. Fixed disk 42 may be a part of computer system 10 or may be separate and accessed through other interface systems. A network interface 48 may provide a connection to a LAN (e.g., a TCP/IP-based local area network (LAN)) or to the Internet itself. Many other devices or subsystems (not shown) may be connected in a similar manner. Also, it is not necessary for all of the devices shown in FIG. 1A to be present to practice the present invention, as discussed below. The configuration of the devices and subsystems shown in FIG. 1A may vary substantially from one computer to the next.

In today's high-performance computers, the link between the CPU and its associated main memory (e.g., CPU 14 and main memory 16, respectively) is critical. Computer programs currently available place imposing demands on a computer's throughput capabilities. This need for increasingly higher bandwidth will continue.

One method for improving the throughput of this interface is to provide a dedicated bus between CPU 14 and main memory 16. Such a bus is shown in FIG. 1A as a memory bus 50. Memory bus 50 allows CPU 14 to communicate data and control signals directly to and from main memory 16. This improves computational performance by providing a pathway directly to the system's main memory that is not subject to traffic generated by the other subsystems in computer system 10. In such systems, the pathway between main memory 16 and bus 12 may be by way of a direct memory access (DMA) hardware construct for example.

FIG. 1B illustrates a block diagram in which components (e.g., CPU 14 and main memory 16) communicate over an interconnect 60 in order to process data. Interconnect 60 is a generalization of memory bus 50, and allows one or more master units such as master units 70(1)-(N) and one or more slave units, such as slave units 80(1)-(N). (The term "N" is used as a general variable, its use should not imply that the number of master units is identical to the number of slave units.) Components attached to interconnect 60 may contain master and slave memory elements. In the case where interconnect 60 serves as memory bus 50, CPU 14 communicates with main memory 16 over interconnect 60 using pipelined memory operations. These pipelined memory operations allow maximum utilization of interconnect 60, which is accomplished by sending data over interconnect 60 as continuously as is reasonably possible given the throughput capabilities of main memory 16.

The block diagram of FIG. 1B is applicable to intrachip, as well as interchip, communications. It will be understood that one or more of slave units 80(1)-(N) may consist of other components in addition to memory (e.g., a processor of some sort). The block diagram of FIG. 1B can, of course, be simplified to the case of a system having only a single master.

FIG. 1C shows a memory device 100. Memory device 100 might be used in a computer system, for example, as main memory 16 of computer system 10, or in combination with similar devices to form main memory 16. Memory device 100 is capable of being read from and written to by a memory controller (not shown). An interconnect 110 is used to communicate control information over control lines 112 and data over data lines 114 from the memory controller to memory device 100. Interconnect 110 is thus analogous to memory bus 50. To support such communications and the storage of data, memory device 100 typically includes three major functional blocks.

The first of these, a transport block 120, is coupled to interconnect 110. Interconnect 110, which includes control signal lines 112 and data signal lines 114, is used to read from and write to memory device 100. Interconnect 110 provides the proper control signals and data when data is to be written to memory device 100. Transport block 120 receives these signals and takes the actions necessary to transfer this information to the remaining portions of memory device 100. When memory device 100 is read, transport block 120 transmits data as data signal lines 114 in response to control signal lines 112. Transport block 120 includes a control transport unit 122 which receives control signal lines 112, and controls a read data transport unit 124 and a write data transport unit 126 to support the communication protocol used in transferring information over interconnect 110 (e.g., transferring information between CPU 14 and main memory 16 over memory bus 50).

In its simplest form, transport block 120 is merely wiring, without any active components whatsoever. In that case, control transport unit 122 would simply be wires, as read data transport unit 124 and write data transport unit 126 would require no control. In effect, transport block 120 is not implemented in such a case. Another possible configuration employs amplifiers to provide the functionality required of transport block 120. In yet another possible configuration, transport block 120 includes serial-to-parallel converters. In this case, control transport unit 122 controls the conversion performed by read data transport unit 124 and write data transport unit 126 (which would be the serial-to-parallel converters). Other equivalent circuits may also be used with equal success.

The second of the major functional blocks is an operations block 130. Operations block 130 receives control information from transport block 120, more specifically from control transport unit 122, which provides the requisite signals to a control operation unit 150.

In FIG. 1C, control operation unit 150 is implemented as an architecture designed to control generic DRAM memory cells. A specific DRAM memory cell architecture (or other architecture), however, may require different control signals, some or all of which may not be provided in the architecture shown in FIG. 1C. Control operation unit 150 includes a sense operation unit 132, a precharge operation unit 134, and a core transfer operation unit 136.

Data being read is transferred from the third functional block, a memory core 180, via data I/O bus 185 to a read data operation unit 160. From read data operation unit 160, the data being read is transferred to read data transport unit 124 (and subsequently, onto data signal lines 114) in response to control signals from control operation unit 150. Read data operation unit 160 may consist of, for example, data buffers (not shown) that buffer the outgoing data signals to drive read data transport unit 124.

Data to be written is transferred from write data transport unit 126 to a write operation unit 170 in response to control signals from control transport unit 122 (if used) and control operation unit 150. Write data operation unit 170 receives write data from write transport unit 126, which is passed on to memory core 180 via data I/O bus 185. As shown, write data operation unit 170 may be controlled by core transfer operation unit 136. Write data operation unit 170 may consist of, for example, data buffers (not shown) that buffer the incoming data signals.

Write data operation unit 170 may also contain mask buffers that buffer mask information received from write data transport unit 126. As with data buffering, these actions may be taken under the control of core transfer operation unit 136. The mask information is then passed to memory core 180 via data I/O bus 185, as well. The mask information is used by the memory core to selectively write parts of the data within the memory core. Alternatively, no mask is employed, with the result that all the data is written unconditionally.

The circuitry of control operation unit 150 may take any number of appropriate configurations, depending in part on the architecture of the memory core employed. For example, the memory cells of memory core 180 may be static random access memory (SRAM) cells, read-only memory (ROM) cells (which can, of course, only be read), dynamic RAM (DRAM) cells, or another type of memory cell. The type of memory cell employed in memory core 180 affects the architecture of control operation unit 150, as different memory cells often require different control signals for their operation.

Operational block 130 thus contains core transfer operation unit 150, read data operation unit 160, and write data operation unit 170. Again, in the simplest configuration of transport block 120, the subsystems of transport block 120 are merely wires. Moreover, the functionality provided by the subsystems of transport block 120 is merely one of transferring data and control information.

Assuming that the memory core employs DRAM-type memory cells, operations which may be performed on memory core 180 (referred to herein as core operations) may be generalized into four primary categories:

1) Precharge;
2) Sense;
3) Read; and
4) Write.

While these generalized operations are dealt with in detail later in this section, they are introduced here to illustrate the following effects on the block diagram of FIG. 1C. Given the generalized operations to be performed, the circuitry of control operation unit 150 may be logically divided into the three subsystems mentioned previously: sense operation unit 132, precharge operation unit 134, and core transfer operation unit 136. Core transfer operation unit 136 controls read data operation unit 160 and write data operation unit 170 when transferring data from and to memory core 180, respectively (i.e., read and write operations). Core transfer operation unit 136 also controls memory core 180, causing memory core 180 to store write data and output read data. Precharge operation unit 134 controls memory core precharge operations, which precharge the selected banks in memory core 180. Sense operation unit 132 is provided for the control of memory core sense operations.

The subsystems of operations block 130 uses the control information received to coordinate movement of control and data information to and from memory core 180. Read data operation unit 160 and a write data operation unit 170 contain circuitry specific to the functions which read and write data from and to memory core 180, respectively. Core transfer operation unit 150 contains circuitry used to control memory core 180, including circuitry for the control of read and write operations. Core interface signals 190 are provided to control memory core 180.

FIG. 2 illustrates a memory core 200, which can serve as memory core 180 in FIG. 1C. Memory core 200 typically includes several basic functional blocks. Memory core 200 is illustrated as including multiple memory banks, memory banks 205(1)-(N). Alternatively, memory core 200 can be implemented using only a single memory bank (e.g., memory bank (1)). Included in each of memory banks 205(1)-(N) are a storage array, exemplified by storage arrays 210(1)-(N), and a set of sense amplifiers, exemplified by sense amplifiers 215(1)-(N). Storage arrays 210(1)-(N) are central to the function of memory core 200, actually holding the data to be stored. Storage arrays 210(1)-(N) are connected to sense amplifiers 215(1)-(N) by bit lines 220(1)-(N), respectively. Such storage arrays are normally organized into rows and, columns of storage cells, each of which typically stores one bit of information, although configurations for storing multiple bits are known in the art.

Also included in memory core 200 are a row decoder 225 and a column decoder 230. A row address 235 is provided to row decoder 225, along with row control signals 240, which cause row decoder 225 to latch a row address thus presented. In turn, row decoder 225 presents this address information to memory banks 205(1)-(N) via row select lines 245. Similarly, a column address 250 is provided to column decoder 230, along with column control signals 255, which cause column decoder 230 to latch a column address thus presented. In turn, column decoder 230 presents this address information to memory banks 205(1)-(N) via column select lines 260 to select which sense amplifiers are connected to the column amplifiers. The column control signals 255 may include mask bit signals to selectively mask individual sense amplifiers in accordance with a predetermined masking scheme.

Column control signals 255 are also provided to column amplifiers 265. Column amplifiers 265 are coupled to sense amplifiers 215(1)-(N) by column I/O lines 266, and amplify the data signals input to and output from sense amplifiers 215(1)-(N). Column amplifiers 265 are also coupled to data I/O bus 185 (from FIG. 1C), permitting the communication of control signals from operations block 130 to the various control structures within memory core 200. The signals aggregated as core interface signals 190 (as illustrated in FIG. 1C) thus include row address 235, row control signals 240, column address 250, and column control signals 255. Thus, the interface to a memory core generally consists of a row address, a column address, a datapath, and various control signals, including mask signals.

As shown in FIG. 2, memory cores can have multiple banks, which allows simultaneous row operations within a given core. The use of multiple banks improves memory performance through increased concurrency and a reduction of conflicts. Each bank has its own storage array and can have its own set of sense amplifiers to allow for independent row operation. The column decoder and datapath are typically shared between banks in order to reduce cost and area requirements, as previously described.

FIG. 3 illustrates a generic storage array 300, in which data is stored in storage cells 305(1,1)-(N,N). Thus, storage array 300 is capable of storing $N^2$ bits, using a common storage cell implementation. As shown, each one of word lines 310(1)-(N) accesses a row of storage cells 305(1,1)-(N,N) (e.g., storage cells 305(1,1)-(1,N)), which in turn transfers the stored data onto internal bit lines 320(1)-(N). Internal bit lines 320(1)-(N) emerge from storage array 300 as bit lines 220 (i.e., an aggregate of bit lines 220(1)-(N), which are connected to sense amplifiers 215(1)-(N)).

Accessing the information in a storage array (i.e., reading data stored in storage arrays 210(1)-(N)) is typically a two step process. First, data is transferred between storage array 300 and a corresponding set of sense amplifiers 215(1)-(N). Next, the data is transferred between the sense amplifiers involved and the column amplifiers 265. Certain memory core architectures do away with the column amplifiers, transferring the data from the sense amplifiers directly to the data I/O bus (i.e., data I/O bus 190).

The first major step, transferring information between storage arrays 210(1)-(N) and sense amplifiers 215(1)-(N), is known as a "row access" and is broken down into the minor steps of precharge and sense. The precharge step prepares the sense amplifiers and bit lines for sensing, typically by equilibrating them to a midpoint reference voltage. During the sense operation, the row address is decoded, a single word line is asserted, the contents of the storage cell is placed on the bit lines, and the sense amplifiers amplify the value to full rail (i.e., a full digital high value), completing the movement of the information from the storage array to the sense amplifiers. Of note is the fact that the sense amplifiers can also serve as a local cache which stores a "page" of data which can be more quickly accessed with column read or write accesses. The second major step, transferring information between the sense amplifiers and the interface, is called a "column access" and is typically performed in one step. However, variations are possible in which this major step is broken up into two minor steps, e.g. putting a pipeline stage at the output of the column decoder. In this case the pipeline timing should be adjusted to account for the extra time involved.

These two steps give rise to the four basic memory operations mentioned previously: precharge, sense, read, and write. A typical memory core can be expected to support these four operations (or some subset thereof). However, certain memory types may require additional operations to support architecture-specific features. The general memory core described provides the basic framework for memory core structure and operations. However, a variety of memory core types, each with slight differences in their structure and function, exist. The three major memory core types are:

Dynamic Random-Access Memory (DRAM)
Static Random-Access Memory (SRAM)
Read-Only Memory (ROM)

The structure of a conventional DRAM core is similar to the generic memory core in FIG. 2. Like memory core 200, the conventional DRAM structure has a row and column storage array organization and uses sense amplifiers to perform row access. As a result, the four primary memory operations (sense, precharge, read and write) are supported. Memory core 200 includes an additional column amplifier block and column amplifiers 265, which are commonly used to speed column access in DRAM (and other memory core types, as well). Also illustrated by FIG. 2 is the use of multiple banks, a common configuration for conventional DRAM cores. As before, the row decoder, column decoder, and column amplifiers are shared among the banks. An alternative configuration replicates these elements for each bank. However, replication typically requires larger die area and thus incurs greater cost.

Inexpensive core designs with multiple banks typically share row decoders, column decoders, and column datapaths between banks to minimize die area, and therefore cost.

Conventional DRAM cores use a single transistor cell, known as a 1T cell. The single transistor accesses a data value stored on a capacitor. The 1T cell is one of the storage cell architectures that employs a single bit fine, as referred to previously. This simple storage cell achieves high storage density, and hence a low cost per bit. However, designs employing such storage cells are subject to two limitations. First, such storage cell architectures exhibit slower access times than certain other storage cells, such as SRAM storage cells. Since the passive storage capacitor can only store a limited amount of charge, row sensing for conventional DRAM storage cells (i.e., 1 T cells) takes longer than for other memory types with actively-driven cells (e.g., SRAM storage cells). Hence, the use of a 1 T storage cell architecture generally results in relatively slow row access and cycle times.

Second, such storage cell architectures require that the data held in each cell be refreshed periodically. Because the bit value is stored on a passive capacitor, the leakage current in the capacitor and access transistor result in degradation of the stored value. As a result, the cell value must be "refreshed" periodically. The refresh operation consists of reading the cell value and re-writing the value back to the cell. These two additional memory operations are named refresh sense and refresh precharge, respectively. In traditional cores, refresh sense and refresh precharge were the same as regular sense and precharge operations. However, with multiple bank cores, special refresh operations may be advantageous to enable dedicated refresh circuits and logic to support multi-bank refresh.

To perform a row access in a conventional DRAM having a single bank, bit lines 220(1)-(N) and sense amplifiers 215(1)-(N) must first be precharged, typically to one-half of the supply voltage (Vdd/2). The row precharge time, $t_{RP}$, is the time required to precharge the row to be sensed. To perform a sense operation, row decoder 225 drives a single word line (e.g., one of word lines 310(1)-(N)) to turn on each of the memory cells' access transistors (not shown) in the row being sensed. The charge on each of the memory cells' storage capacitors (also not shown) transfers to its respective bit line, slightly changing the corresponding bit line's voltage. The sense amplifier detects this small voltage change and drives the bit lines to either Vdd or ground, depending on the voltage change produced by the capacitor's charge. The wordline must be held high a minimum time period of $t_{RAS,MIN}$ to complete the sensing operation. At some time before the bit lines reach their final value, a column read or write access can begin. The time between the start of the sense operation and the earliest allowable column access time is $t_{RCD}$ (the row-tocolumn access delay). The total time to perform both precharge and sense is $t_{RC}$, the row cycle time, and is a primary metric for core performance.

Row access timing for DRAMs with multiple banks, such as that illustrated in FIG. 2, differs slightly from the preceding example. The delay $t_{RP}$ specifies the minimum delay between precharge operations to different banks. This indicates that the precharge circuitry is able to precharge the next row (which may be the same row originally precharged) after a period of $t_{PP}$. Typically, $t_{PP}$ is approximately equal (or even less than) $t_{RP}$, assuming the same memory core and device architecture are employed. Similarly, $t_{SS}$ specifies the minimum delay between performing sense operations on different banks. As before, the sensing on different banks can be carried out more quickly than repeated sensing on the same bank. These parameters indicate that, while the precharge circuitry can precharge a row every $t_{PP}$ seconds and sense circuitry can sense every $t_{SS}$ seconds (both of which are usually measured in ns), a single bank's storage array can only be precharged (or sensed) every $t_{RC}$ seconds (measured in ns). Thus, a memory core employing multiple banks can be read from and written to more quickly in situations where different banks are being accessed.

Typical column cycle times and access times greatly depend on the type of sense amplifier circuit employed. This is because the sense amplifiers drive the selected data onto the column data I/O wires, and must be able to drive the capacitance that those wires represent (i.e., the amplifier must be able to charge that capacitance in the requisite time). Increased speeds can be achieved by improving the sense amplifier's drive capability, thus charging the column data VO wires capacitance more quickly. This could be done by using more or larger transistors in the sense amplifier circuit. However, such modifications greatly increase die area, and so cost, especially because the sense amplifier circuit is so heavily replicated. Thus, the desire to minimize the die area of commodity DRAMs limits the further reduction of column access speeds by this technique.

In a conventional DRAM, the column decoder's output drives a single column select line, which selects some or all of the outputs from the sense amplifiers. The column decoder's output may be placed in a register for pipelined designs. The selected sense amplifiers then drive their respective data onto the column I/O wires. To speed column access time, the column I/O lines are typically differential and sensed using differential column amplifiers (e.g., column amplifiers 265 in FIG. 2), which amplify small voltage differences on the column I/O wires and drive data I/O bus 185. The width of the column I/O bus determines the data granularity of each column access (also known as CAS block granularity).

Unfortunately, the preceding DRAM timing parameters (and others) can vary widely due to variations in manufacturing processes, supply voltage, operating temperature, and process generations, among other factors. In order for a memory architecture to operate properly given such variations, it is important for a DRAM protocol to be able to support these varied row and column timings.

In a conventional DRAM, column control signals 255 of FIG. 2 typically include a column latch signal, a column cycle signal, and write mask signals. The column latch signal precedes the column cycle signal, and causes column decoder 230 to latch the column address (column address 250). In this type of architecture, the column cycle signal indicates the actual beginning of the column access process, and therefore is required to wait for the column address to be latched. Some DRAM memory cores also include the ability to mask write data. With masking, a write operation is performed such that some bits or bytes of the datapath are not actually written to the storage array depending on the mask pattern. Typically, the mask pattern is delivered to the column amplifier write circuit, which inhibits the write data in an appropriate manner. Moreover, data I/O bus 185 and/or column I/O lines 266 can be either bidirectional, in which case write and read data are multiplexed on the same bus, or unidirectional, in which case separate write and read datapaths are provided. While FIG. 2 illustrates data I/O bus 185 as a bidirectional bus, the use of a unidirectional bus can easily be envisioned.

FIG. 2 may also be used to illustrate a memory core employing an SRAM storage cell architecture. The typical SRAM memory core architecture shares the core structure and functionality of the conventional DRAM memory architecture discussed previously. Moreover, accesses are performed in a two-step process similar to that used in accessing data held in a DRAM memory core. First, during the sense operation, the information is transferred between the storage array and the sense amplifiers. Second, in the column access operation, the information is transferred between the sense amplifiers and the interface. Another similarity to DRAM is the need to precharge the bitlines prior to sensing operations, although typical precharge value is the supply voltage, not half of the supply voltage normally used in conventional DRAM architectures.

SRAM memory cores differ markedly from DRAM memory cores in the architecture of the storage cells used in each. In an SRAM memory architecture, data is stored statically, typically using a circuit of several transistors. A typical SRAM storage cell uses cross-coupled CMOS inverters to store a single data bit, and employs the bit line pairs as illustrated in FIG. 3 (internal bit lines 220(1)-(N), e.g., differential bit lines). A word line (one of word lines 310(1)-(N)) turns on access transistors within the selected SRAM storage cells (e.g., storage cells 305(1,1)-(1,N)), which connect each cell in the row to the differential bit lines (internal bit lines 320(1)-(N)). Unlike a DRAM cell, however, each SRAM storage cell actively drives the stored value onto its respective bit line pair. This results in faster access times. The static nature of the SRAM cell also eliminates the need for refresh operations. However, the static cell uses more transistors and therefore requires more area than a DRAM cell. As with the DRAM, the four primitive operations of an SRAM are sense, precharge, read, and write. However, because an SRAM storage cell operates so quickly, precharge and sense may be performed for each read (even within page). This is in contrast to DRAM devices (known as page-mode DRAM), which save time by storing a page of data in the device's sense amplifiers, as noted previously.

Read-only memory (ROM) cores store information according to an electrical connection at each cell site which join rows to columns. Typically, a single transistor forms the electrical connection at each cell site. There are a variety of ROM cell types, including erasable programmable ROM storage (EPROM), electrically erasable programmable ROM (EEPROM), flash ROM, and mask-programmable ROM. Their differences lie in the type of transistor used in each architecture's storage cell. However, ROMs share the storage array architecture illustrated in FIG. 2, which requires a row and column decode of the address for each data access.

Unlike SRAM and DRAM devices, not all ROM devices include sense amplifier circuits (e.g., sense amplifiers 215(1)-(N)). Sense amplifiers are only used in certain ROM architectures which require fast access times. For such ROM devices, the primitive operations are sense, precharge, and read. For slower ROM devices that do not use sense amplifiers, the selected data values are driven directly from the storage cell circuitry to output amplifiers, which in turn drive the data I/O bus. For these ROMs, the single primitive operation is read.

A significant limitation on the effective bandwidth of memory bus 50 (i.e., interconnect 110) can arise as the result of the issuance of certain combinations of read and write operations. For example, the issuance of certain read/write combinations may intrinsically introduce inefficiencies in the utilization of interconnect 110. For example, a delay (also known as a data bubble) may occur when a write operation is followed by a read operation. Because the write data is immediately present on interconnect 110 and the read data is not present until a later time (determined by the access time of the device being read), a data bubble between the write data and read data naturally occurs. This data bubble obviously impairs the efficient utilization of interconnect 110 and the column I/O datapath.

Moreover, because it is preferable to share certain interconnect resources 110, certain combinations of read and write operations are not allowable. These combinations result in data bubbles between the data transferred by certain of the read and write operations within these combinations. These delays, also known as data bubbles, are of particular importance in systems which are configured to maintain full or almost full utilization of interconnect 110 by constantly (or nearly constantly) transferring data to and from components attached thereto (e.g., CPU 14 and main memory 16), and within the memory devices which make up main memory 16.

In a conventional memory of the design shown in FIG. 2 and 3, the resource ordering for read and write operations differs slightly. A read operation uses resources in the order:
  control signal lines 112
  column I/O datapath (including data I/O bus 185 and column I/O lines 266)
  data signal lines 114 while a write operation uses them in the order:
  control signal lines 112
  data signal lines 114
  column I/O datapath (including data I/O bus 185 and column I/O lines 266)

These differences in the ordering of resource usage give rise to resource conflicts when read and write operations are issued because control signals issued over control signal lines 114 cause data to be transferred immediately, in relative terms. Thus, if data signal lines 114 and the column I/O datapath are bidirectional (as is desirable), conflicts can occur between read data and write data because each transfer requires the use of these resources.

What is therefore desirable is a protocol and apparatus that provide improved interconnect utilization. In particular, the protocol should permit read and write operations to be issued in any order without the need to delay one or more of the operations because of resource conflicts. Moreover, the apparatus should be configured to perform this function in the case of bidirectional interconnect and column I/O datapaths.

SUMMARY OF THE INVENTION

The present invention relates to the transfer of data in computer systems. More specifically, the present invention relates to a protocol and apparatus that provide improved interconnect utilization. In particular, a two-step write operation according to the present invention avoids resource conflicts, thus permitting read and write operations to be issued in any order while maintaining continuous data traffic.

In one embodiment of the present invention, a method for storing data in a memory device is described. The method includes the following steps. The method employs a two-step technique which allows the out-of-order completion of read and write operations. When a write operation requires a resource needed for the completion of a read operation, the data being written is stored in a write data buffer in the memory device. The write data is stored in the buffer until a datapath is available to communicate the data to the memory device's memory core. Once the resource is free (or the memory device, or its controller force the write to complete) the data is written to the memory core of the memory device using the now-free datapath.

In another embodiment of the present invention, a memory device is described. The memory device includes a memory core in which data may be stored. The memory core includes a storage array, in which the data is actually stored, and a bidirectional datapath coupled to the storage array, which allows data to be read from and written to the storage array. The memory device also includes a datapath that is coupled to the memory core's bidirectional datapath, and allows data to be communicated into and out of the memory device. The memory device also includes a write data buffer coupled to the datapath. This data buffer is configured to store the data to be written to the memory core. In this manner, the data buffer allows one or more quanta of data to be stored for a period of time, again allowing their related write operations to complete in an out-of-order sequence by waiting until the memory core's bidirectional datapath is free.

These and other embodiments of the present invention, as well as its advantages and features are described in more detail in conjunction with the text below and attached figures.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DESCRIPTION OF THE PREFERRED EMBODIMENTS

I. Introduction

Figure 1A:
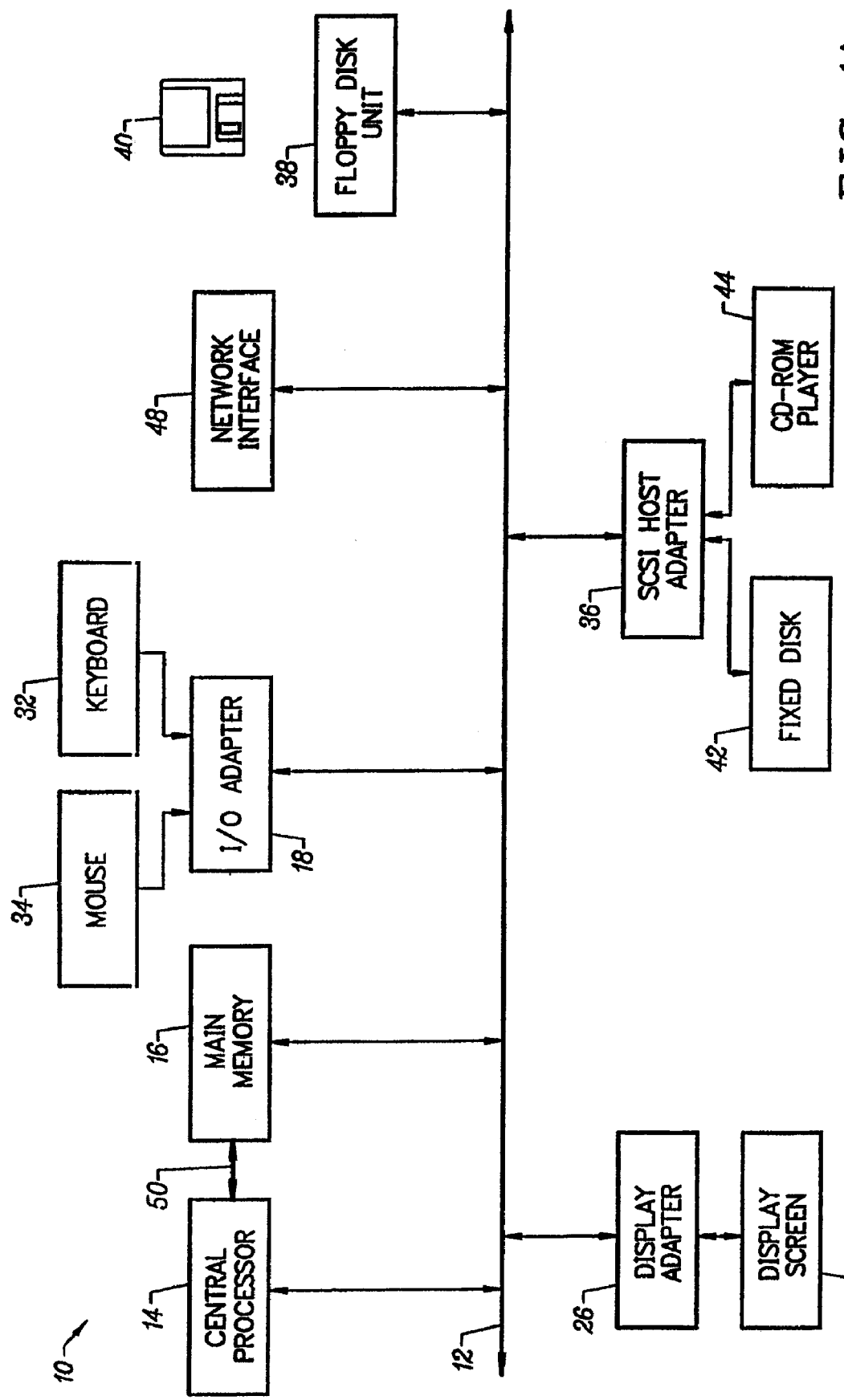
FIG. 1A is a block diagram of a computer system of the prior art.
Figure 1B:
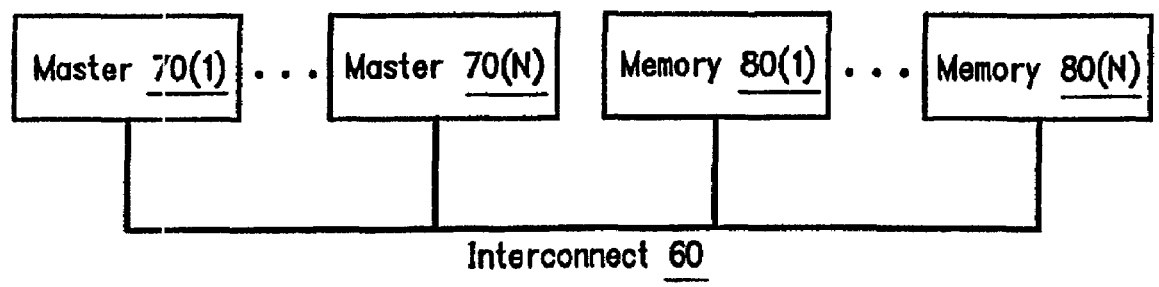
FIG. 1B is a block diagram of an interconnect of the prior art.

The present invention provides a protocol, which may be implemented in a memory device, that supports improved utilization of an interconnect between a bus master (e.g., CPU 14 of FIG. 1A) and a bus slave (e.g., main memory 16 of FIG. 1A). In particular, a two-step write operation is used to avoid resource conflicts. In this manner, a memory device according to the present invention permits the issuance of read and write operations in any order while maintaining continuous data traffic.

A memory device according to the present invention maintains continuous data traffic by employing a two-step technique which allows the out-of-order completion of read and write operations. When a write operation requires a resource needed for the completion of a read operation, the data being written is stored in a write data buffer in the memory device. The write data is stored in the buffer until a datapath is available to communicate the data to the memory device's memory core. Once the resource is free (or the memory device, or its controller force the write to complete) the data is written to the memory core of the memory device using the now-free datapath.

II. The Use of Delayed Write Operations

Figure 4:
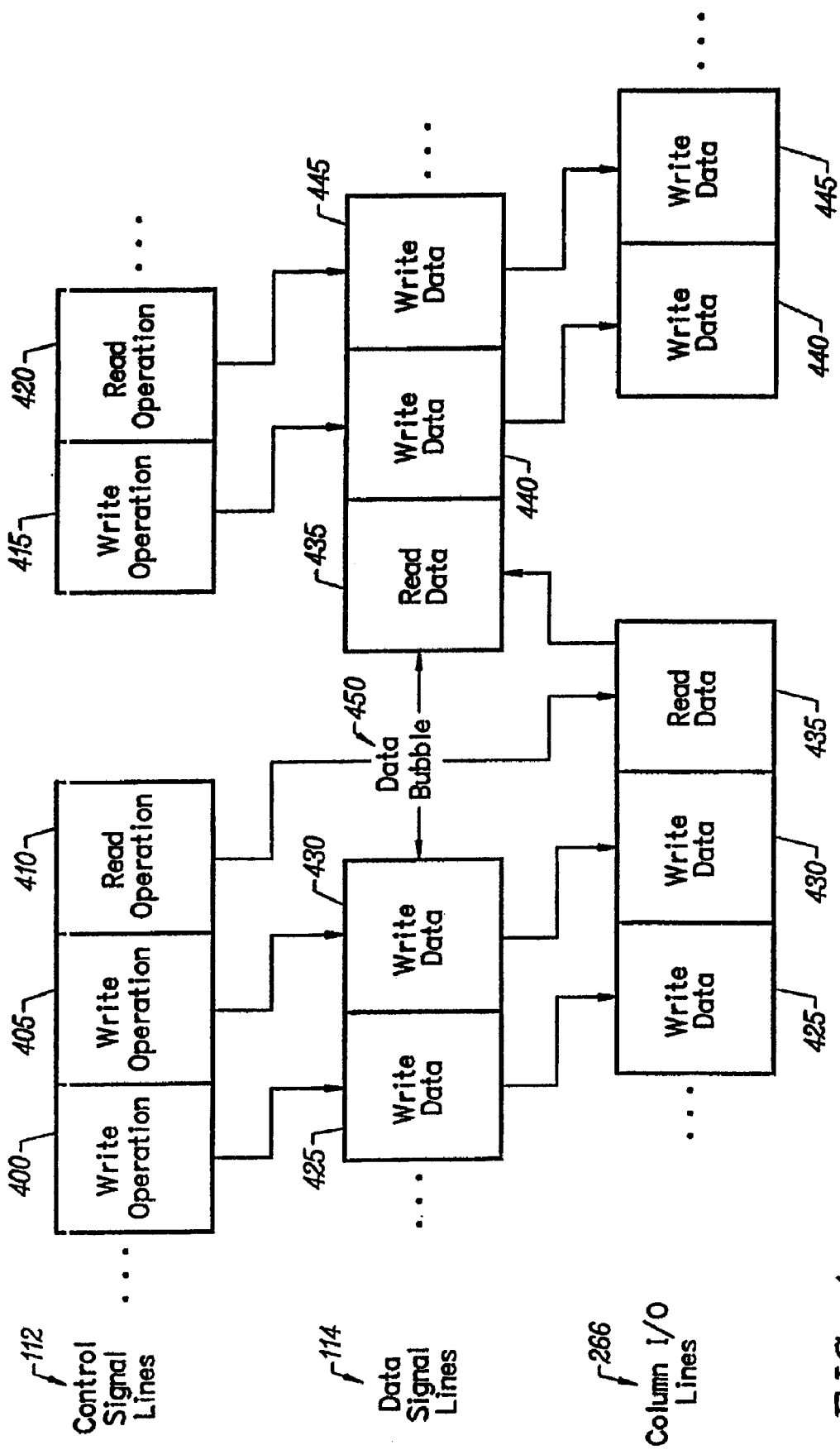
FIG. 4 is a timing diagram showing the data bubble that can occur in a memory device.

FIG. 4 illustrates a situation in which a data bubble is formed by a write operation followed by a read operation. Write operations 400 and 405, followed by a read operation 410 and write operations 415 and 420, are communicated over control signal lines 112 to memory device 100, which forwards this control information to memory core 200. Write operations 400 and 405 input write data 425 and 430 to memory device 100 via data signal lines 114. Write data 425 and 430 are communicated to memory core 200, and then to one or more of memory banks 205(1)-(N) via column I/O lines 266.

Figure 2:
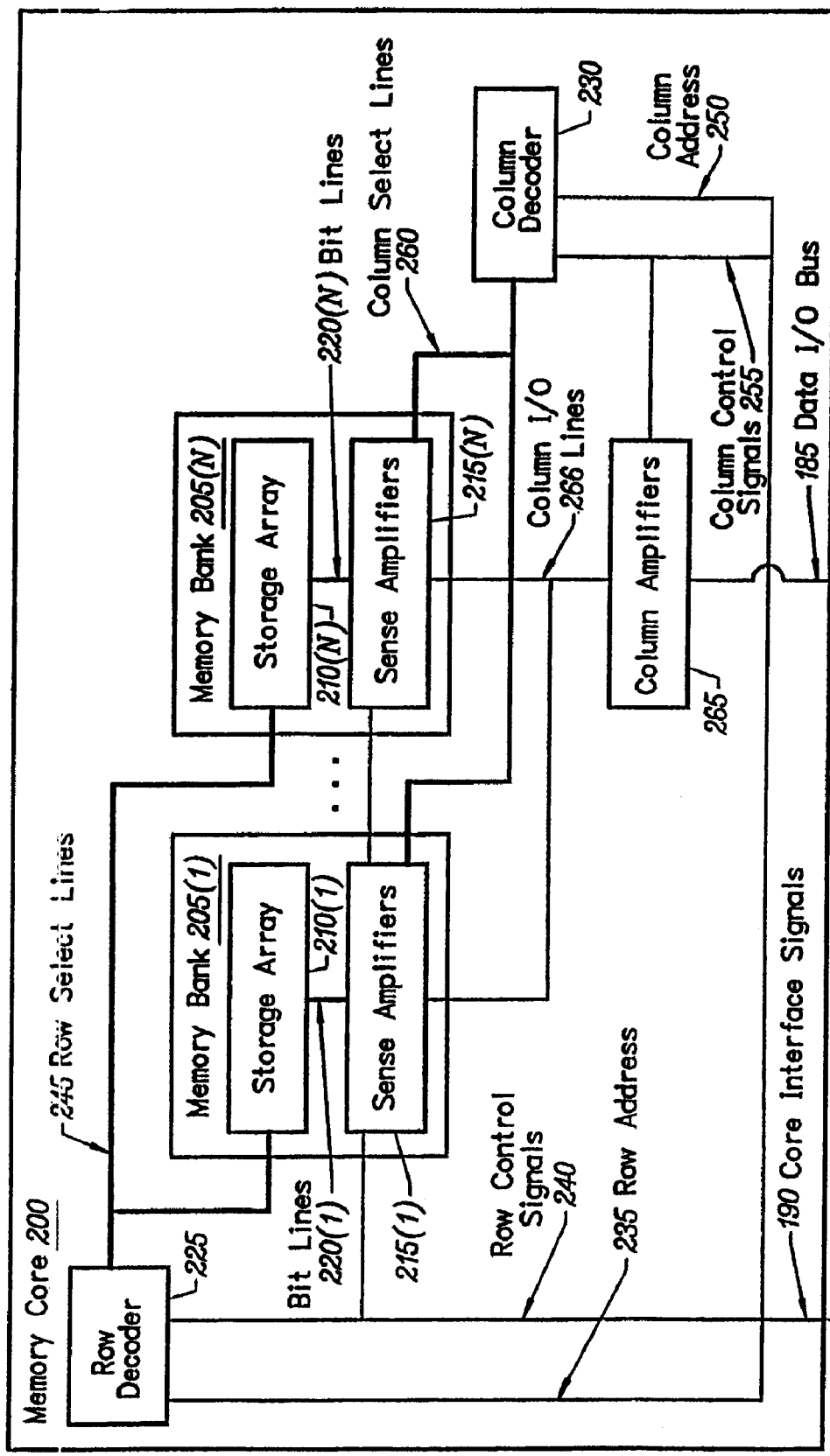
FIG. 2 is a block diagram of a generic memory core of the prior art.

Read operation 410 reads data from memory device 100 by causing memory core 200 to output read data 435 on column I/O lines 266, as shown in FIG. 2, and then to data I/O bus 185. Read data 435 is then communicated to data signal lines 114 via operations block 130 and transport block 120. In a fashion similar to the preceding write operations, write operations 415 and 420 input write data 440 and 445 to memory device 100 via data signal lines 114, and then to one or more of memory banks 205(1)-(N) via column I/O lines 266.

As can be seen in FIG. 4, no resource conflicts are observed in the case where a write operation follows another write operation (e.g., write operations 400 and 405). Moreover, data can also be efficiently transferred in the case where a write operation follows a read operation (e.g., read operation 410 and write operation 415). This is because the read data can followed immediately with write data. Although not illustrated in FIG. 4, the case where a read operation is followed by another read operation also experiences no resource conflicts. These combinations fail to experience such conflicts because the data transfer requested by the given operations are not in contention for the same resources. For example, write data 425 is transferred from data signal lines 114 to column I/O lines 266 before write data 430 needs data signal lines 114. Thus, no resource conflict occurs.

However, a data bubble 450 occurs in the transfer of data on interconnect 110 in the case where a read operation follows a write operation (e.g., write operation 405 and read operation 410). In that case, because the write data is presented immediately and the read data is not present until a later time, a data bubble between the write data and read data naturally occurs. The data bubble appears regardless of whether write operation 405 and read operation 410 are directed to the same or to different memory devices (e.g., memory devices within main memory 16) attached to interconnect 110. It is noted that the delay from control signals 112 to column I/O lines 266 is identical for read and write operations.

The solution to the problem created by data bubble 450 is to match the timing of the write operation's use of datapath resources to the read operation's use of those resources. Typically, the optimal delay for a write operation does not quite match the delay for a read operation because interconnect 110 has an intrinsic turnaround time. This turnaround time is the time required to switch the direction of the circuitry which drives interconnect 110 (e.g., the time it takes to switch the direction of bidirectional buffers or amplifiers). Instead, the delay for a write operation should be equal to the minimum read delay minus the minimum turnaround time for interconnect 110. There is no need to change the control-to-data delay for the write operation as a function of memory device position on interconnect 110 because the turnaround delay grows as the read delay grows.

Figure 5:
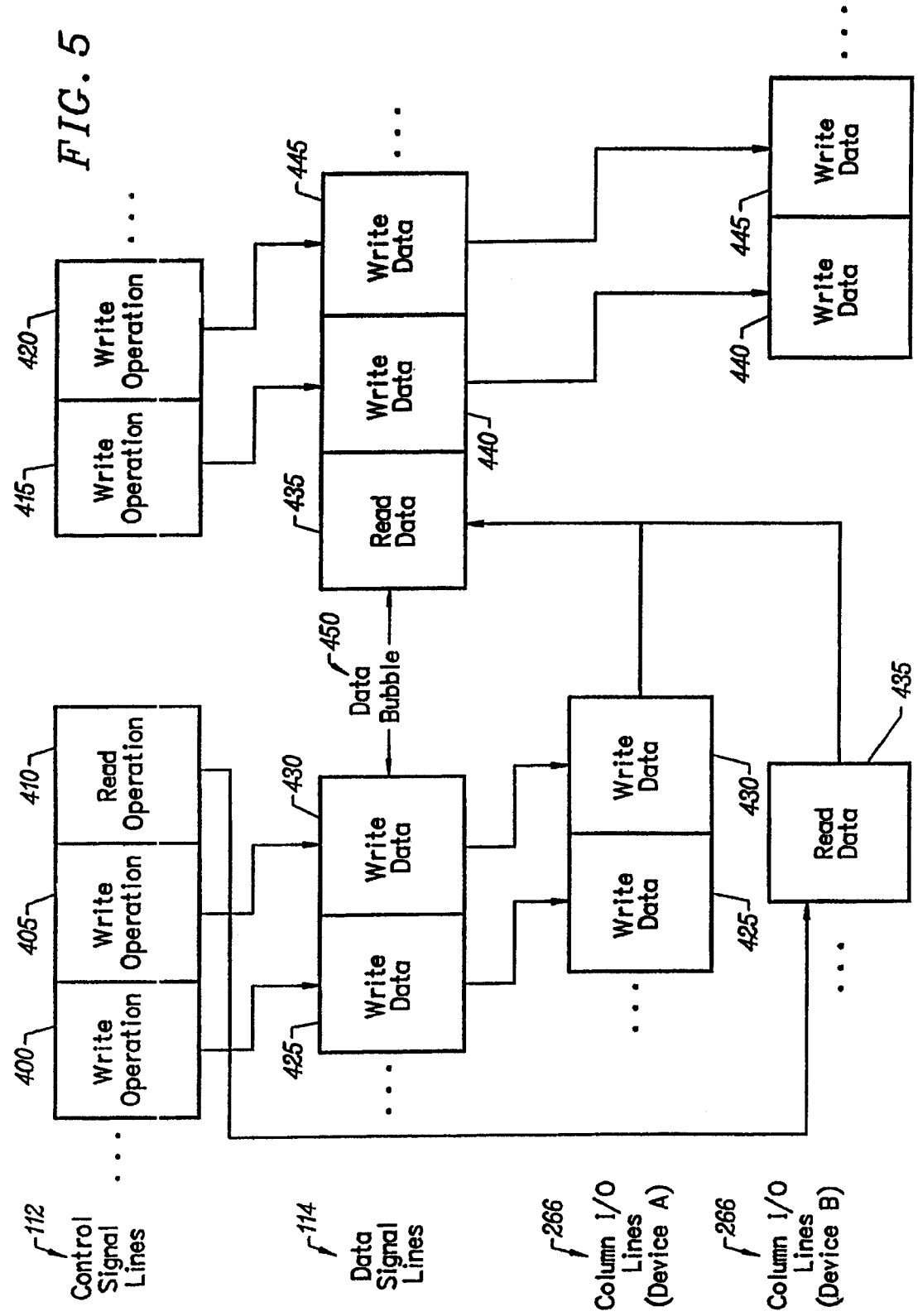
FIG. 5 is a timing diagram showing the reduction of the data bubble of FIG. 4.

FIG. 5 shows the result of delaying the write to match the read. The delay from the issuance of the write control to the beginning of the data write is set to match the delay from the issuance of the read control to the beginning of the data read. As long as different column data paths are used to perform the read column cycle and the write column cycle (i.e., the read and write operations are to different memory devices), the data bubble is shrunk to the minimum required by channel turnaround requirements and is no longer a function of control or data resource conflicts. This is illustrated in FIG. 5 by the use of column I/O lines 266(A) and 266(B), each of which designates the column I/O lines of separate memory devices ((A) and (B)). As long as different column data paths are used to perform the read column cycle and the write column cycle, the data bubble is shrunk to the minimum required by channel turnaround requirements and is no longer a function of control or data resource conflicts. The need for this restriction is illustrated by the fact that read data 435 is accessed at the same time as write data 425 and write data 430. Moreover, since write latency is not vitally important to application performance, this modification does not cause any loss in application performance, so long as the writes and reads are directed to separate column data paths and the write occurs before the expiration of $t_{RAS,MIN}$ (the minimum time between sensing a row and precharging another row in the same bank).

Delaying write operations thus helps optimize data bandwidth efficiency over a bidirectional datapath. The technique adds a delay between control signals indicating a write operation and data being written so that the delay between the two is similar to that of read operations. Maintaining this "pattern" for read and write operations improves pipeline efficiency over a bidirectional datapath. As noted, this is true only for operations to separate column resources. It is to be understood that, due to the timing relationship between column control signals and column I/O data, the limitations experienced by one column resource are substantially the same constraints experienced by the other column resource. In other words, because the time between a column control operation and the data resulting from that operation is so short, a resource conflict on one column resource will imply a resource conflict on the other column resource.

Figure 6:
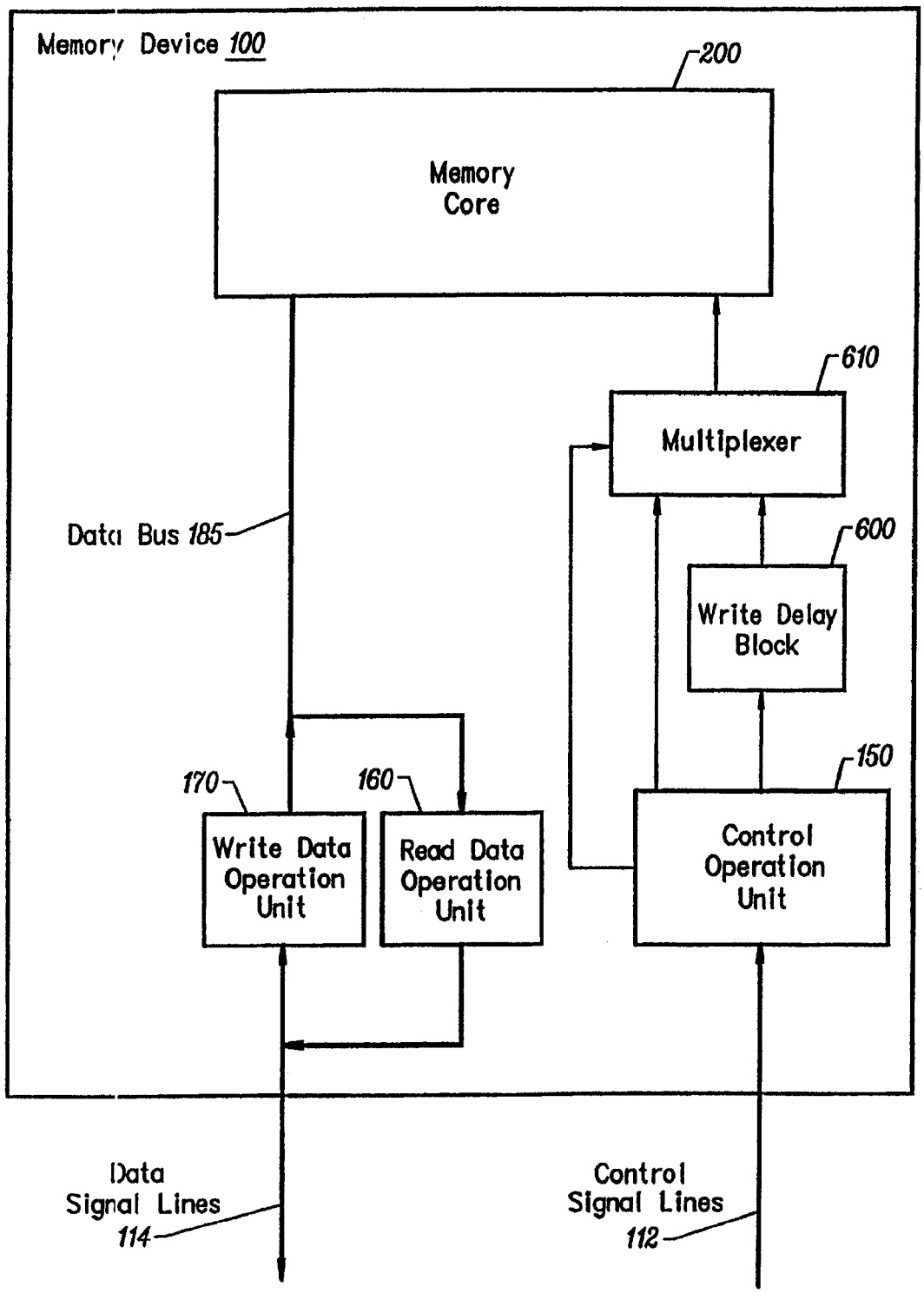
FIG. 6 is a block diagram of one embodiment of a memory device containing circuitry that reduces the data bubble of FIG. 4.

FIG. 6 illustrates the modifications to memory device 100 necessary to provide delayed write functionality. Column access control information is delayed for writes relative to when the column control information is presented to the core for reads by a write delay block 600. The outputs of write delay block 600 and control operation block 150 are coupled to a multiplexer 610 which selects between these outputs, under the control of control operation block 150. The output selected depends upon the type of operation to be performed (i.e., whether the current operation is a read or a write). If the current operation is a read operation, control operation block 150 to select the output of control operation block 150, while a write operation would cause control operation block 150 selects the output of write delay block 600. While a multiplexer is shown in FIG. 6, other embodiments of this mechanism may be employed, as would be obvious to those skilled in the art. For example, a state machine could be used to introduce new delaying state transitions when the operation is a write.

However, even if a delayed write technique is employed, a data bubble 450 may still be observed in the transfer of data over column I/O lines 266 (and data I/O bus 185). For example, given the operations illustrated in FIG. 5, if the operations are all to be performed within a single device, there will obviously be a resource conflict on column I/O lines 266, as well as on column control signals 255 (assuming that device has bidirectional datapaths).

The resource conflict which gives rise to data bubble 450 occurs within memory device 100. More specifically, the resource conflict occurs on the datapath within memory core 200. This is because column I/O lines 266 are bidirectional, as is data I/O bus 185. Column I/O lines 266 are normally designed to be bidirectional to reduce the cost and area of the given memory design. As noted, the offending write and read operations must be directed to the same device for this phenomenon to occur. However, this resource conflict could still exist notwithstanding the use of delayed write techniques. The fundamental problem is the resource conflict which occurs when a read and a write operation require the use of a device's column resources. Thus, a solution to the problem of a resource conflict with regard to a device's column resources is made necessary by such a situation.

III. The Use of Two-Step Write Operations

If a write operation is patterned so that the data interconnect utilization is not limited by read/write conflicts when employing independent column paths, the case of using a single column path to achieve the same utilization must be addressed, in order to avoid data bubbles within memory device 100. The root of the problem exposed in this section is the interaction of the bidirectional data interconnect resource with the bidirectional column I/O resource. We could resolve this problem by making one or both of these resources unidirectional. (The two-step write technique disclosed herein would, of course, only be applicable to resolving a conflict on a column resource). In the preferred embodiment we make them both bidirectional for cost reasons. It is possible that changes in manufacturing technology would make it cost effective for one or the other of the data resources to be unidirectional.

If nothing more than delaying write operations is done, then a write followed by a read results in the timing shown in FIG. 5. As noted, a delayed write causes a delay for a read to the same device because the write operation is committed once the write control information is presented on the control interconnect and so the column circuitry must wait for the write data so that it can complete the write into memory core 180, using the column I/O resource before the core access step of the read operation can begin. This not only wastes bandwidth on the data resource, but also delays the read, raising the average service time for reads.

The basic problem is to achieve the timing of the write control, addressing, mask, and data at the memory core implied by FIG. 5 even though the data resource timing has been delayed. This timing of the write information needs to be achieved without introducing the delay shown in FIG. 4. Moreover, if a write delay is employed, the write must be performed without removing the delay of the write data introduced to avoid the resource contention for interconnect 110 solved by the circuitry of FIG. 6.

One solution is to breakup writes into a two-step sequence. In one step, the data is transferred from the master to a buffer in the memory device. This step will be referred to herein as the transport step. In the second step, the data is transferred from the buffer into the memory core via the column I/O datapath. This step will be referred to herein as the retire step.

Figure 1C:
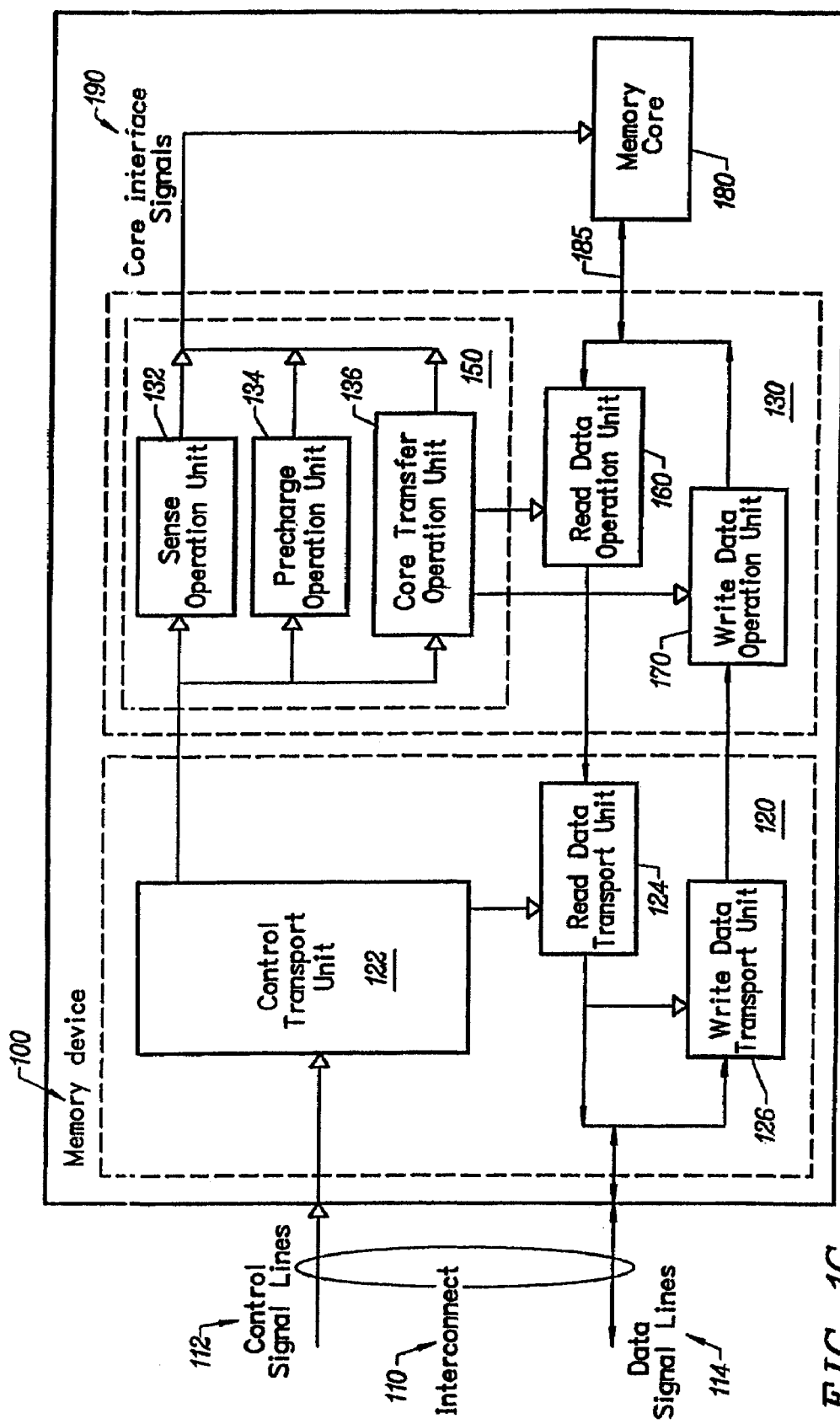
FIG. 1C is a block diagram of a generic memory device of the prior art.
Figure 7:
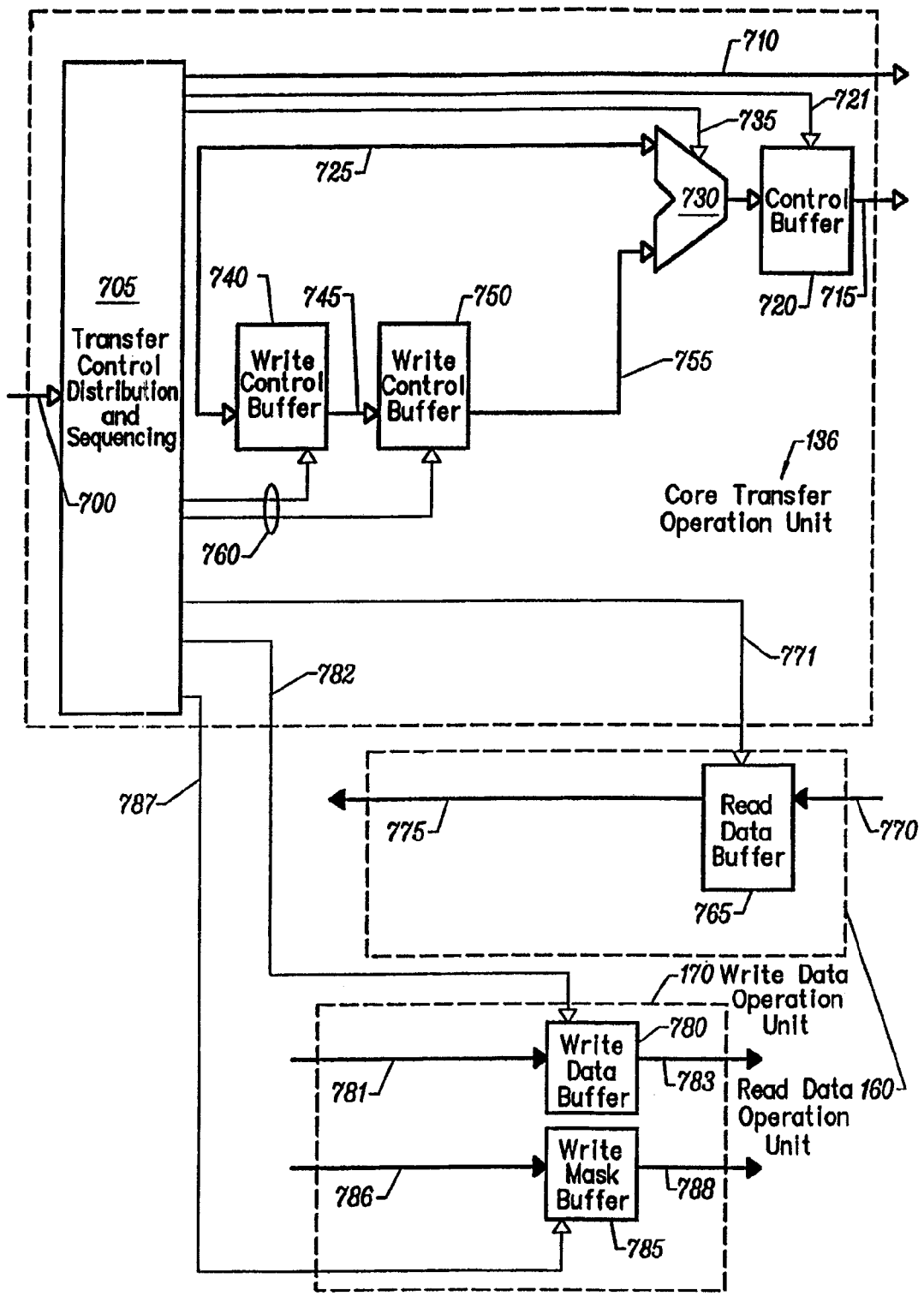
FIG. 7 is a block diagram of one embodiment of a memory device containing circuitry that may be utilized in accordance with the present invention.

FIG. 7 shows the structure of the core transfer operation unit 136, read data operation unit 160, and write data operation unit 170 for a memory that performs operations that are signaled on the control lines. The operation block 130 of FIG. 1C is shown in greater detail in FIG. 7. Control signals 700 are received from control transport unit 122. Transfer, control, distribution, and sequence (TCDS) block 705 produces signals to control the memory core 180, the read data operation unit 160, and write data operation unit 170. TCDS block 705 handles transfer, control, signal distribution, and sequencing responsibilities, in this configuration, as analogous blocks do in the block diagrams described below. Signals 710 are the edge based control signals for the memory core. Signals 715 are signals that are presented to the core for a duration of time, and usually have setup and hold requirements with respect to the transition times of signals 710, and are produced by control buffer 720. For a read operation, control buffer 720 receives control signals directly from TCDS block 705 via signals 725 through multiplexer 730 which is controlled by signal 735. For a write operation, control buffer 720 receives control signals from TCDS block 705 via write control buffer 740, signals 745, write control buffer 750, signals 755, and multiplexer 730 (under the control of signal 735). Write control buffers 740 and 750 are controlled by signals 760. For write control buffer write operations, signals 710 are timed to correspond to the arrival of the operation to signals 715. Write control buffers 740 and 750 delay the application of the operation control to the memory core. This delay allows the data corresponding to the buffered write operation to be issued later, better matching the timing of the write operation to that of the read operation. Other embodiments may use fewer or additional blocks to change the amount of the delay.

Read data buffer 765 receives read data on signals 770 from memory core 180, at times controlled by signal 771. This data is passed on to the transport block 120 via signals 775. In another embodiment, read data buffer 765 is an amplifier driving signals 775 without timing signal 771. In yet another embodiment, read data operation unit 160 is comprised only of interconnect. Other variations for read data operation unit 160 are possible, depending on specific drive and timing characteristics of memory core 180.

Write data buffer 780 receives write data from transport block 120 via signals 781 at times controlled by signal 782. This data is passed on to the memory core 180 via signals 783. Write mask buffer 785 receives mask data from the transport unit on signals 786 at times controlled by signal 787. The mask information is passed on to memory core 180 via signals 788. Mask data is used by memory core 180 to selectively write, or not write, parts of the data within the memory core. In another embodiment, no mask is used, with the result that all the data is written unconditionally.

Figure 8:
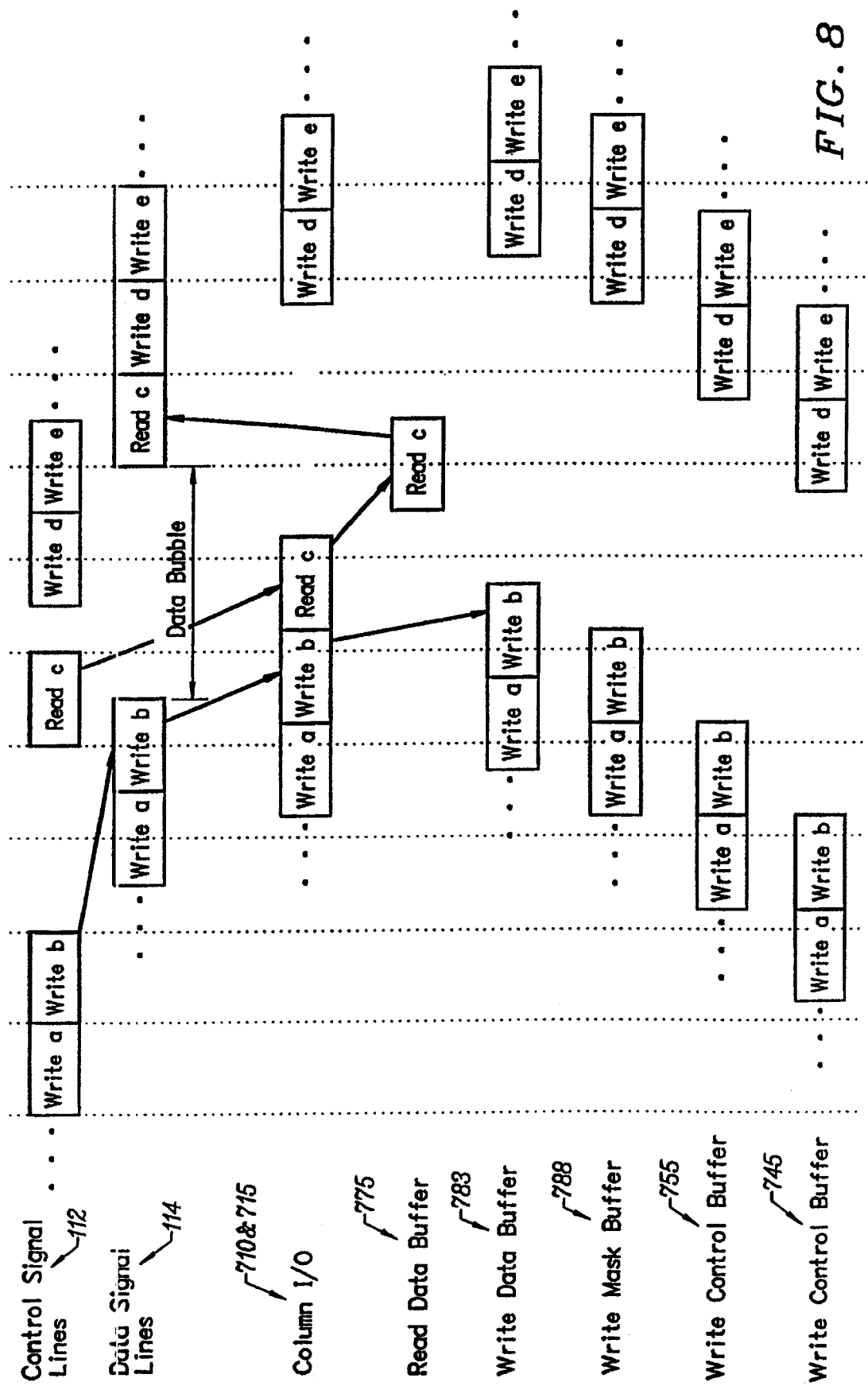
FIG. 8 is a timing diagram showing a data bubble which may be remedied using the circuit of FIG. 7.

FIG. 8 is a timing diagram illustrating the segregated control and data signals associated with FIG. 1C and FIG. 7. The control signals 700 are applied to TCDS block 705. The write data sent to the memory device is delivered on signals 781, while the read data from the memory device is sent by signals 775. In one embodiment, the data signal lines are not segregated so that read data and write data are transmitted on the same wires at different times. In another embodiment, the data signal lines are further segregated so that some wires transmit only write data and other wires transmit only read data. The write mask is sent on either the control signal lines 112, or the data signal lines. In one embodiment, the write mask is sent only on the control signal lines. Alternatively, the write mask may be sent only on data signal lines 114. In another embodiment, the write mask is sent on both of control signal lines 112 and data signal lines 114.

The highlighted write operation in FIG. 8 shows the write control and the write data being transmitted at separate times on control signal lines 112 and data signal lines 114, and used to operate the core with signals 710, 715, 783 and 788. The timing relationship, in contrast to FIG. 4, shows the delay between control and data on control signal lines 112 and data signal lines 114. After the arrival of the data, the application of control and data and mask signals to memory core 180 is done to complete the operation.

The highlighted read operation in FIG. 8 shows the read control being transmitted on control signal lines 112, which causes memory core 180 to be controlled by signals 710 and 715. The characteristics of memory core 180 affect the time at which the read data is available and delivered via signals 775, which are transmitted from memory device 180 on data signal lines 114.

The similar timing relationships for a read operation and a write operation, on control signal lines 112 and data signal lines 114, allow back-to-back operations for read and write, in either order. In order to do so for a write followed by a read, however, the operations must be directed to a different device, which may be done only in a memory system comprised of multiple memory devices which are all connected by control signal lines 112 and data signal lines 114. FIG. 8 illustrates that, when a write is followed by a read to the same device, the read operation on wires 710 and 715 must be timed to follow the write operation on the same wires. This necessitates the separation of the two operations on control signal lines 112 and data signal lines 114, so that a data bubble exists on data signal lines 114. In one embodiment, the time of both the read control, the read data, the write control and the write data are 4 cycles of a synchronizing clock. In this embodiment, the memory core has timing characteristics supporting the relationships shown in FIG. 8. For such an embodiment, the loss of utilization of the data signal lines 114 is shown in FIG. 8 as a data bubble of 10 cycles in duration. In other embodiments, the data bubble may be of a different duration and timed by different means.

The loss of the utilization for data signal lines 114 causes a decrease in effectiveness for the memory system which contains the memory device. This loss of utilization is significant because the occurrence of writes followed by reads to the same device may be frequent, depending on the usage of the memory system, especially when there are one or a small number of memory devices comprising the memory subsystem connected by control signal lines 112 and data signal lines 114.

Figure 9:
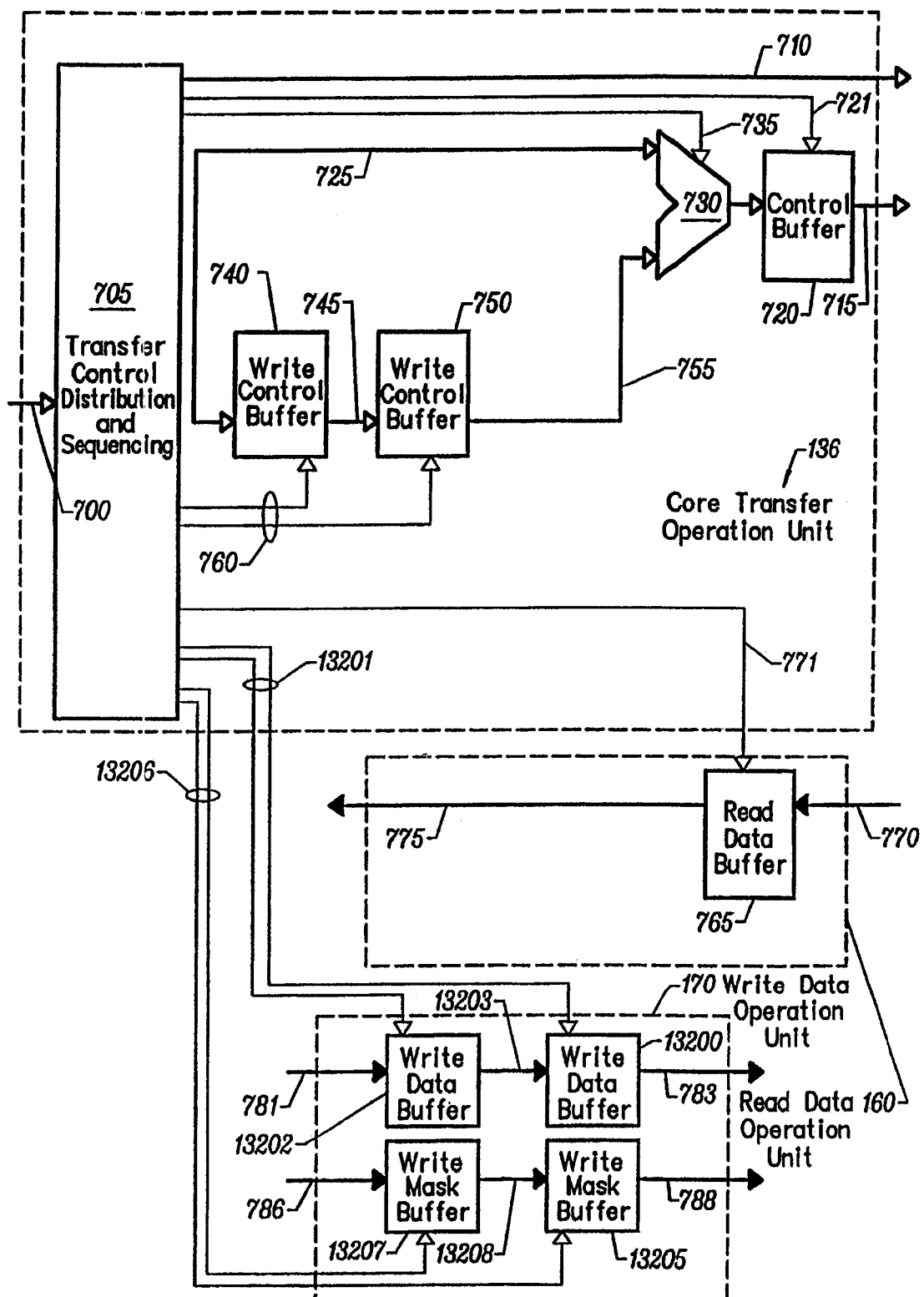
FIG. 9 is a block diagram of one embodiment of a memory device containing circuitry according to the present invention.

FIG. 9 shows the structure of the core transfer operation, read data operation and write data operation units for a memory that performs operations that are signaled on the control lines as soon as is practical. Control signals 700 are received from the transport block 120. TCDS block 705, read data operation unit 160, and write operation unit 170 produce signals to control the memory core 180. Signals 710 are the control signals for the memory core and are preferably edge based. Signals 715 are signals that are presented to memory core 180 for a duration of time, and usually have setup and hold requirements with respect to the transition times of signals 710, and are produced by block 720. For a read operation, control buffer 720 receives control signals directly from block TCDS 705 via signals 725 through multiplexer 730, which is controlled by signal 735. For a write operation, control buffer 720 receives control signals from TCDS block 705 via write control buffer 740, signals 745, write control buffer 750, signals 755 and multiplexer 730. Write buffers 740 and 750 are controlled by signals 760. For a write operation, signals 760 are timed to correspond to the arrival of the operation via signals 715. The effect of the write control buffers 740 and 750 is to delay the application of the operation control to the memory core. Another effect of write control-buffers 740 and 750 is to allow storage of the write control information so that they may be passed on to the memory core for operation based on some later control indication, rather than just passing through on some fixed schedule. Other embodiments may use fewer or additional blocks to change the amount of the delay and storage. The operation of write control buffers 740 and 750 of FIG. 9 can thus parallel that of write control buffers 740 and 750 of FIG. 7, if desired, but need not do so.

Read data buffer 765 receives read data on signals 770 from the memory core 180, at times controlled by signal 771. The data is passed on to transport block 120 via signals 775. In another embodiment, read data buffer 765 is an amplifier capable of driving signals 775, without the need for timing signal 771. In yet another embodiment, read data operation unit 160 includes only interconnect. Other variations for read data operation unit 160 are possible, depending on specific drive and timing characteristics of the memory core.

Write data buffer 13202 receives write data from transport block 120 on signals 781 and is controlled by signal 13201. Write data buffer 13202 is an additional write data buffer, that is also controlled by signal 13201 so that it passes data through to write data buffer 13200 directly in some cases, but stores the data for later passing to write data buffer 13200 in other cases. The write data buffer 13200 receives write data from write data buffer 13202 via signals 13203, under the control of signal 13201, and presents the data to memory core 180 on signals 783. In an analogous fashion, mask data is passed using signals 786, 13208, and 788 with mask data being stored in write mask buffers 13207 and 13205. Mask data is used by memory core 180 to selectively write, or not write, parts of the data within the memory core. In another embodiment, no mask is used so that all the data is written unconditionally.

By providing write data buffer 13200 (and write mask buffer 13205), memory device 100 allows write operations to be split into two operations, transport and retire. First, the write data (and mask) is transported to write data buffer 13200 (and write mask buffer 13205) using, for example, interconnect 110. Upon receiving a retire command (in whatever form), the write data is communicated to memory core 180. This allows write operations, which might otherwise be in contention for the column resources of memory device 100, to complete at a time when no conflicts exist with regard to the now-available column resources.

Figure 10:
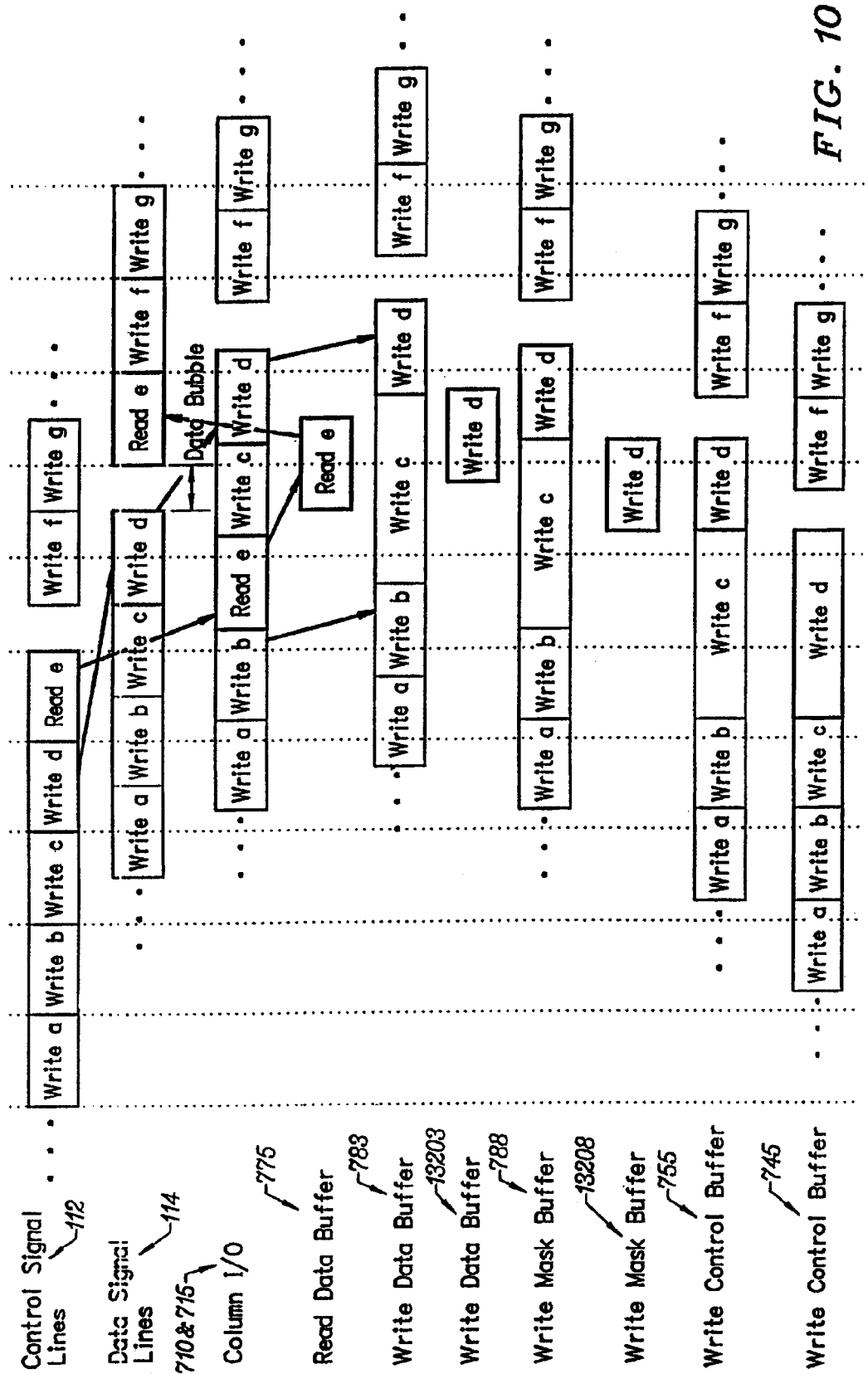
FIG. 10 is a timing diagram showing the reduction of the data bubble using the circuitry of FIG. 9.

FIG. 10 is a timing diagram relating the segregated control and data signals from FIG. 1C and FIG. 9. The control signals are sent via signals 700. The write data sent to the memory device is received via signals 781, while the read data from memory device 100 is sent via signals 775. Write mask data is received via signals 786. In one embodiment, the data wires are not segregated so that read data and write data are transmitted on the same wires at different times. In another embodiment, the data wires are further segregated so that some wires transmit only write data and other wires transmit only read data. The write mask is sent over either the control wires or the data wires. In one embodiment, the write mask is sent using only the control signal lines. In another embodiment, the write mask is sent using only the data signal lines. In another embodiment, the write mask is sent on both control signal lines and the data signal lines.

The write operation labeled "a" in FIG. 10 shows the write control and the write data being transmitted at different times on control signal lines 112 and data signal lines 114, and used to operate memory 180 core with signals 710, 715, 783, and 788. The timing relationship is the same as for all the write operations of FIG. 8. After the arrival of the data, the application of control and data and mask to the memory core is done to fulfill the operation.

The highlighted write operation labeled "d" and its predecessor illustrate a different timing relationship. The operation of these writes at memory core 100 via signals 710 and 715 are reordered to follow the read that the writes precede on control signal lines 112. This timing relationship is made possible by the separation of the control that signals the transport of the write data from the control that causes the write operation at the memory core, referred to as a retire operation. In one embodiment the retire control is a specific operation code as part of a control sequence. This is an example of an explicit retire command. In another embodiment, the retire control is implicitly indicated by the reception of any control that arrives when write data is arrived at 783 and any control is indicated that does not require a read operation to be performed. In another embodiment, the retire control is indicated when write data is arrived at wires 783 and either no further operation is signaled on control signal lines 112, or any control is indicated that does not require a read operation to be performed.

The highlighted read operation in FIG. 10 shows the read control being transmitted on control signal lines 112, which causes the memory core to be controlled by signals 710 and 715. The characteristics of memory core 180 affect the time at which the read data is available and delivered via signals 775, which are transmitted from the memory device on data signal lines 114.

Figure 3:
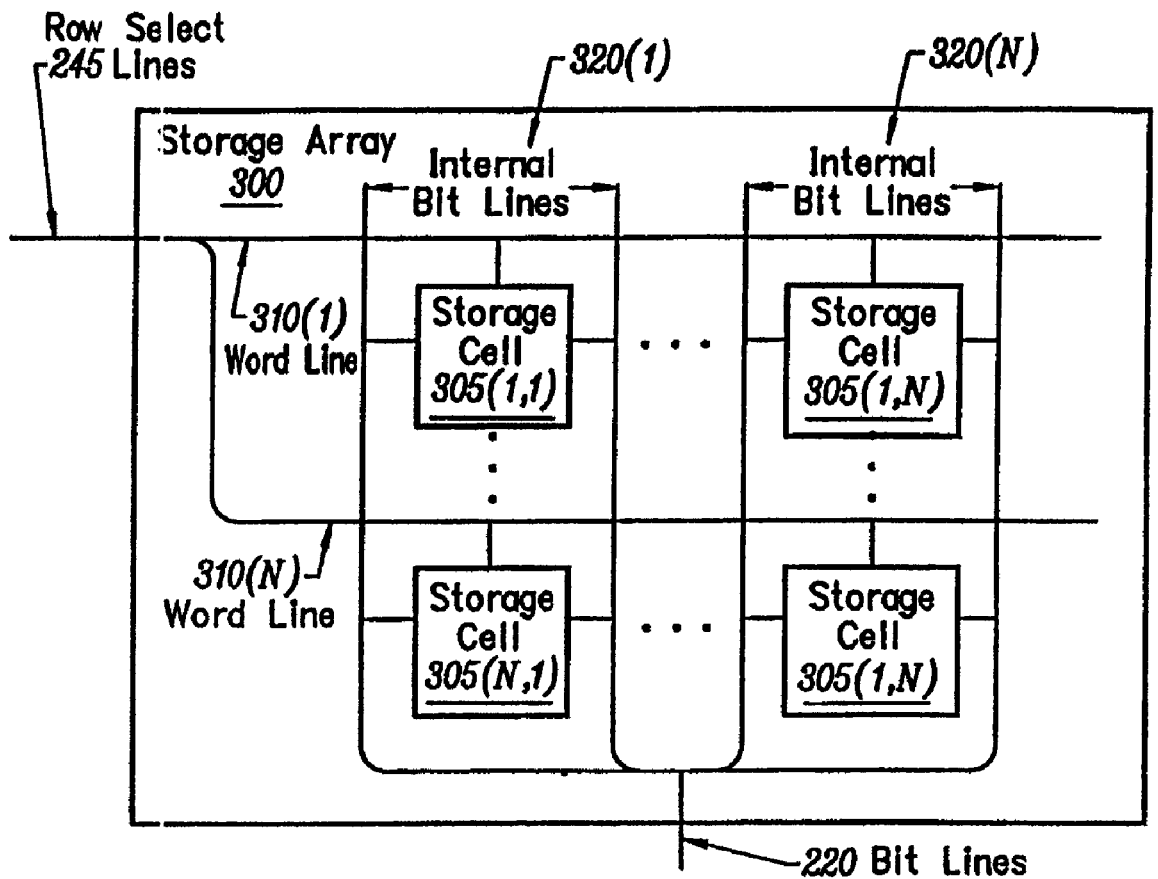
FIG. 3 is a block diagram of a generic storage array of the prior art.

The similar timing relationships for a read operation and a write operation, on control signal lines 112 and data signal lines 114, allow back-to-back operations for read and write. This may be performed when the operations are to different devices (as in the case illustrated in FIG. 3, 7 and 8), but also when the operations are to the same device, due to the reordering that the retire control allows.

In general, one control indicator is used to send the write data on data signal lines 114. A retire control indicator is used to perform the operation at the memory core. Additional control indicators may be used to signal any other control information for the write, such as the addresses or masks, as long as all the control information arrives in time for the memory operation indicated by the retire control indicator.

The ability to generally perform back-to-back write and read operations allows high utilization of data signal lines 114 providing a high performance memory system.

The reordered writes of FIG. 9 and 10 allow a loss of coherency if the data read is from the same location as one of the writes that has been delayed. The structure indicated relies on the originator of the memory operations to maintain coherency. This may be done in many ways know to one skilled in the art. In one instance, if the read location corresponds to one of the write locations, the read operation is delayed until the corresponding write operation is retired. In another instance, a copy of the write data is maintained by originator and merged with the read information, or replaces the read operation.

Figure 11:
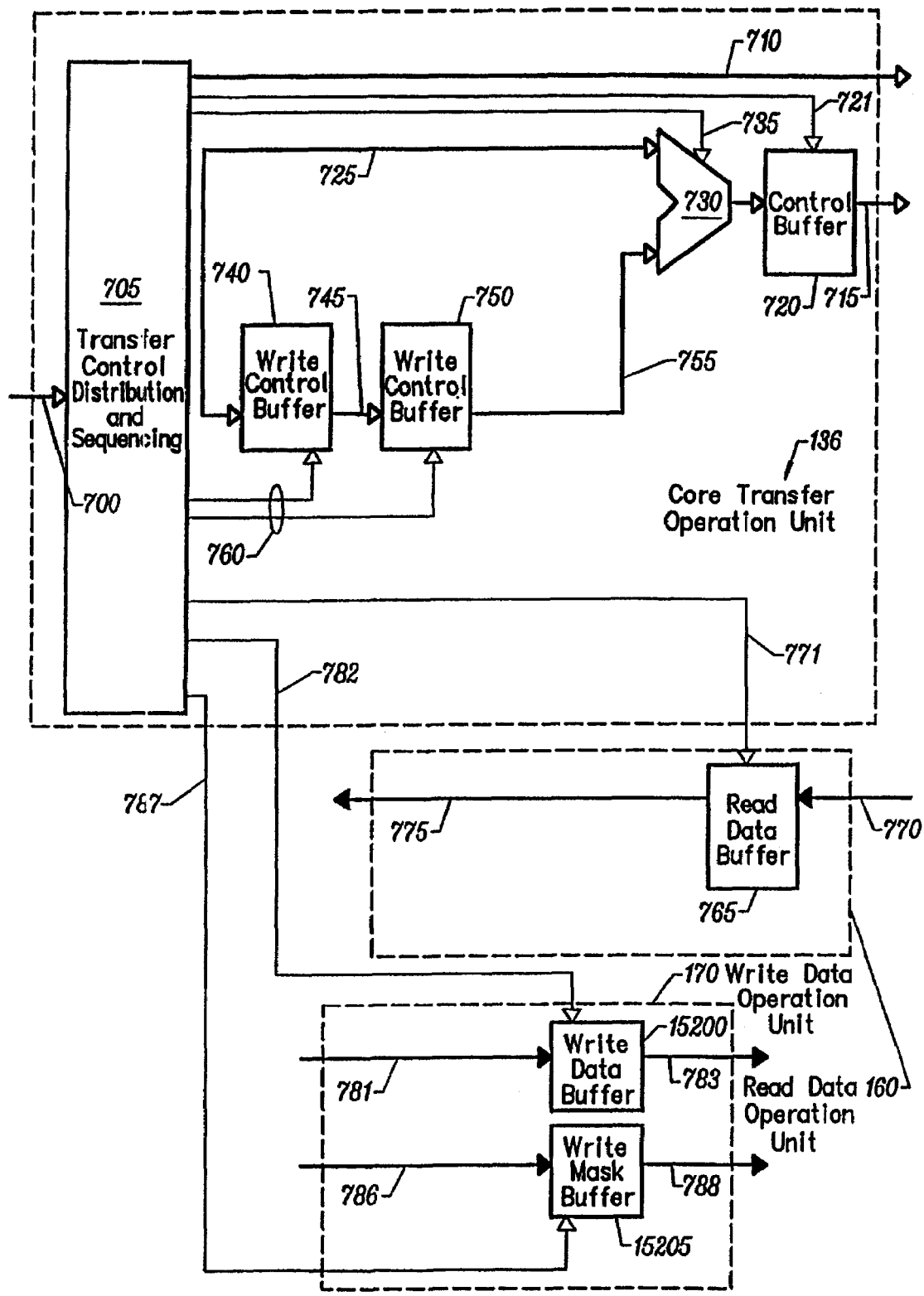
FIG. 11 is a block diagram of one embodiment of a memory device containing circuitry according to the present invention.

FIG. 11 shows a structure similar to that of FIG. 9, except that one bank of the write data and mask buffers is removed, as a cost consideration. In this case, the master unit (e.g., a memory controller) holds the write data (that would normally be held in a write buffer in memory device 100) until that data is needed or is scheduled to arrive as the write buffer is freed.

FIG. 11 shows the structure of the memory core transfer operation, read data operation, and write data operation units for a memory that performs operations that are signaled on the control lines as soon as is practical. Control signals 700 are received from transport block 120. TCDS block 705, read data operation unit 160, and write operation unit 170 produce signals to control memory core 180. Signals 710 are the control signals for memory core 180 and are preferably edge based. Signals 715 are signals that are presented to memory core 180 for a duration of time, and usually have setup and hold requirements with respect to the transition times of signals 710, and are produced by block 720. For a read operation, control buffer 720 receives control signals directly from block TCDS 705 via signals 725 through multiplexer 730, which is controlled by signal 735. For a write operation, control buffer 720 receives control signals from TCDS block 705 via write control buffer 740, signals 745, write control buffer 750, signals 755 and multiplexer 730. Write buffers 740 and 750 are controlled by signals 760. For a write operation, signals 710 are timed to correspond to the arrival of the-operation via signals 715. The effect of the blocks 740 and 750 is to delay the application of the operation control to the memory core. Another effect of write control buffers 740 and 750 is to allow storage of the write control information so that they may be passed on to the memory core for operation based on some later control indication, rather than just passing through on some fixed schedule. Other embodiments may use fewer or additional blocks to change the amount of the delay and storage.

Read data buffer 765 receives read data on signals 770 from the memory core 180, at times controlled by signal 771. The data is passed on to transport block 120 via signals 775. In another embodiment, read data buffer 765 is an amplifier capable of driving signals 775, without the need for timing signal 771. In yet another embodiment, read data operation unit 160 includes only interconnect. Other variations for read data operation unit 160 are possible, depending on specific drive and timing characteristics of the memory core.

Write data buffer 15200 receives write data from transport block 120 on signals 781 and is controlled by signal 782 and presents the data to memory core 180 via signals 783. In an analogous fashion, mask data is passed using signals 786 and 787 with mask data being stored in write mask buffer 15205. Mask data is used by memory core 180 to selectively write, or not write, parts of the data within the memory core. In another embodiment, no mask is used so that all the data is written unconditionally.

By providing write data buffer 15200 (and write mask buffer 15205), memory device 100 allows write operations to be split into two operations, transport and retire. First, the write data (and mask) is transported to write data buffer 15200 (and write mask buffer 15205) using, for example, interconnect 110. Upon receiving a retire command (in whatever form), the write data is communicated to memory core 180. This allows read operations, which might otherwise be in contention for the column resources of memory device 100, to complete at a time when no conflicts exist with regard to the now-available column resources.

However, unlike the circuit in FIG. 9, the circuit of FIG. 11 has only one write data buffer, write data buffer 15200 (and so, only one write mask buffer, write mask buffer 15205). Thus, to avoid overwriting the data (and mask) held in memory device 100, the memory controller must hold the last write "transported," (or schedule its transport to coincide with the freed write buffer) as it cannot necessarily be written (along with the related mask data) to write data buffer 15200 (and write mask buffer 15205). Moreover, the memory controller, in such a configuration, must maintain information on the write it is holding, and must be made aware of the retiring of the write held in the memory controller. Thus, the complexity of the memory controller is increased in this embodiment, to provide the necessary capabilities for maintaining and reacting to such information. The benefit of this embodiment, however, is the reduction in complexity enjoyed by memory device 100. The reduction in complexity of memory device 100 is important for two reasons, among others. First, the cost reduction such a configuration provides to memory device 100 affects the commercial viability of such a system, reducing the cost per chip. Second, because there are far more memory devices than controllers in the average system, the cost of the system also can be expected to drop. Thus, pushing the complexity from the memory devices to the memory controller is an important step in reducing the overall system cost and complexity.

Figure 12:
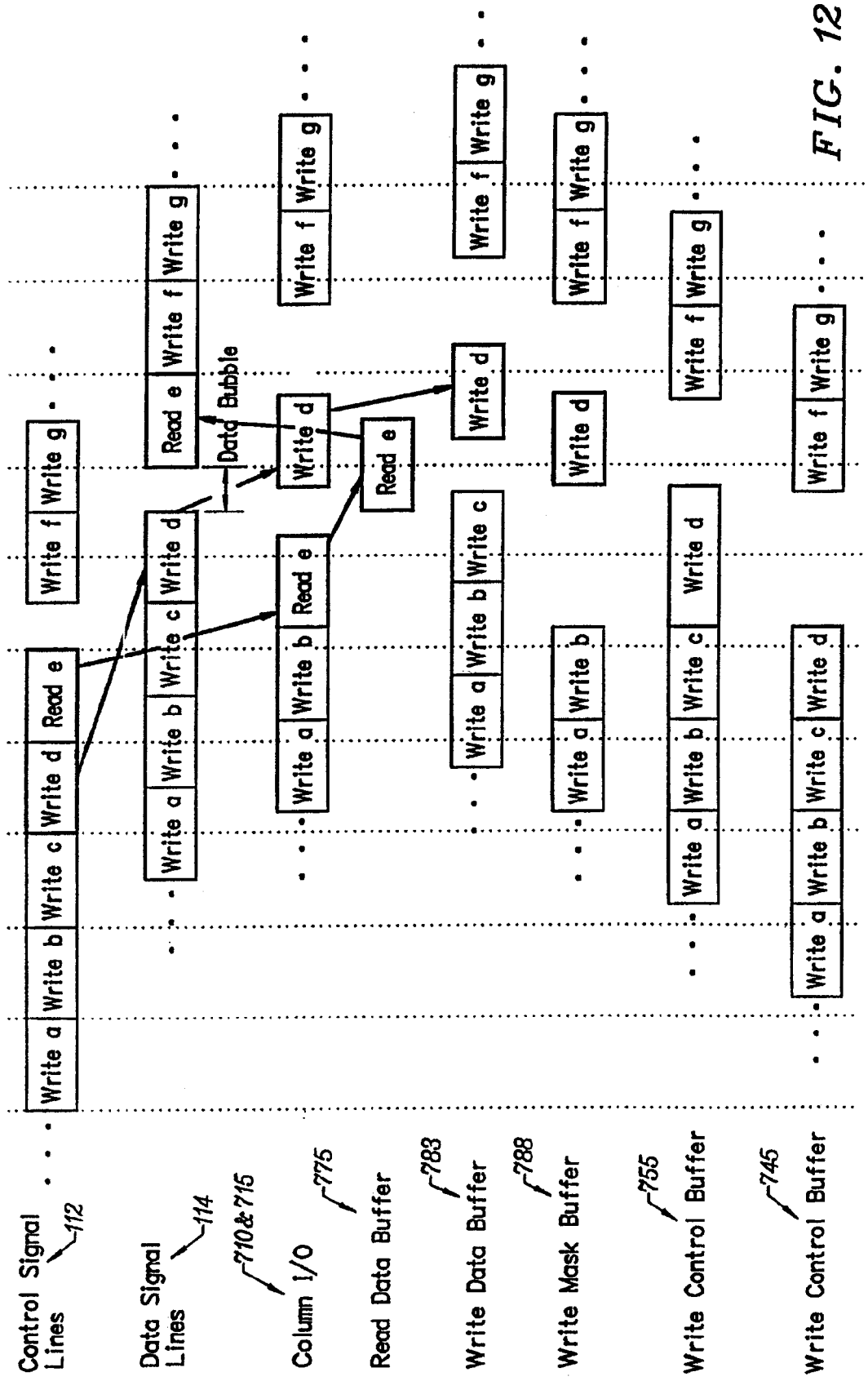
FIG. 12 is a timing diagram showing the reduction of the data bubble using the circuitry of FIG. 11 in the case of a write operation followed by a read operation.
Figure 13:
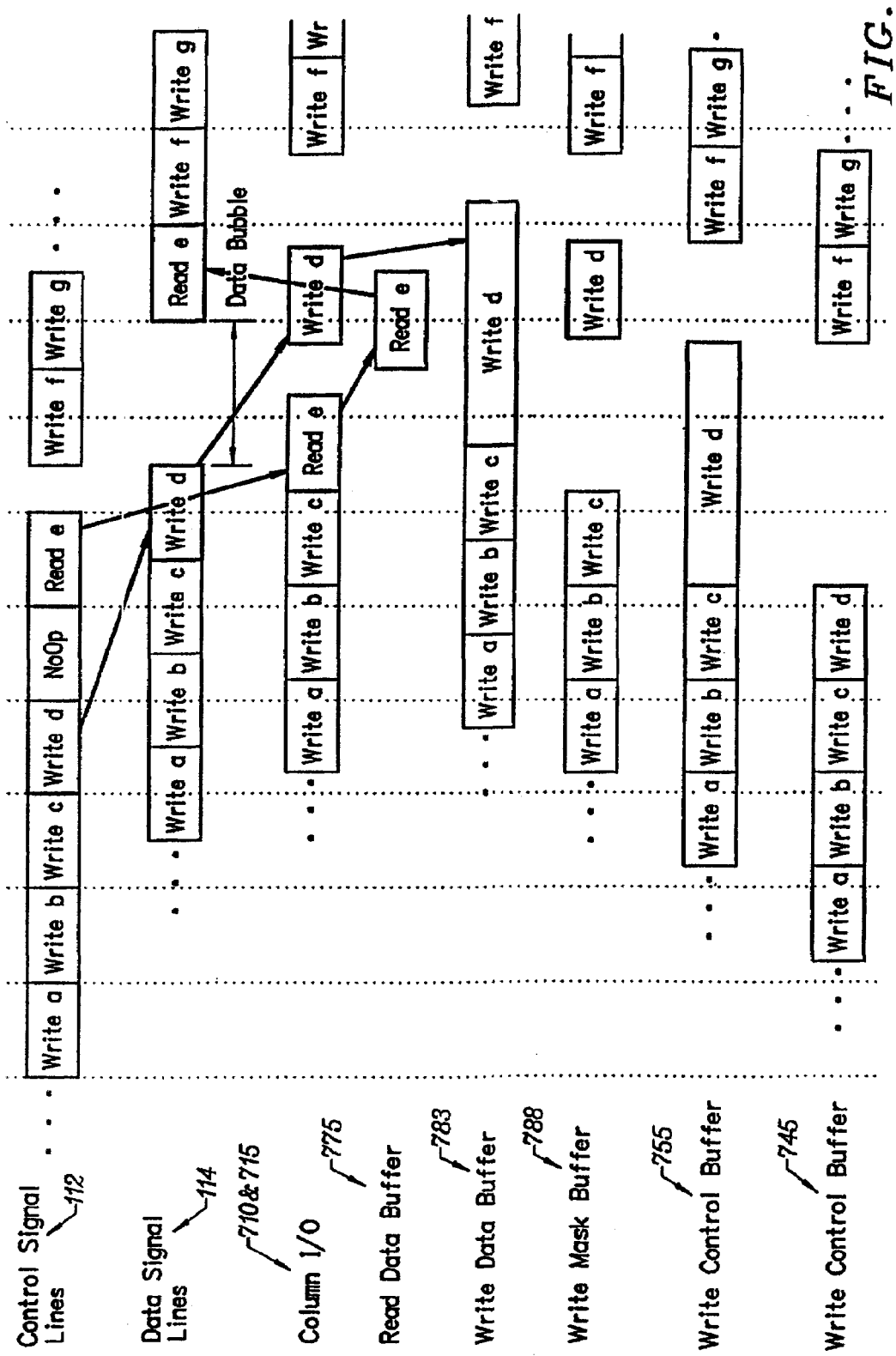
FIG. 13 is a timing diagram showing the reduction of the data bubble as in FIG. 9, but with a no-op operation between the write and read operations.
Figure 14:
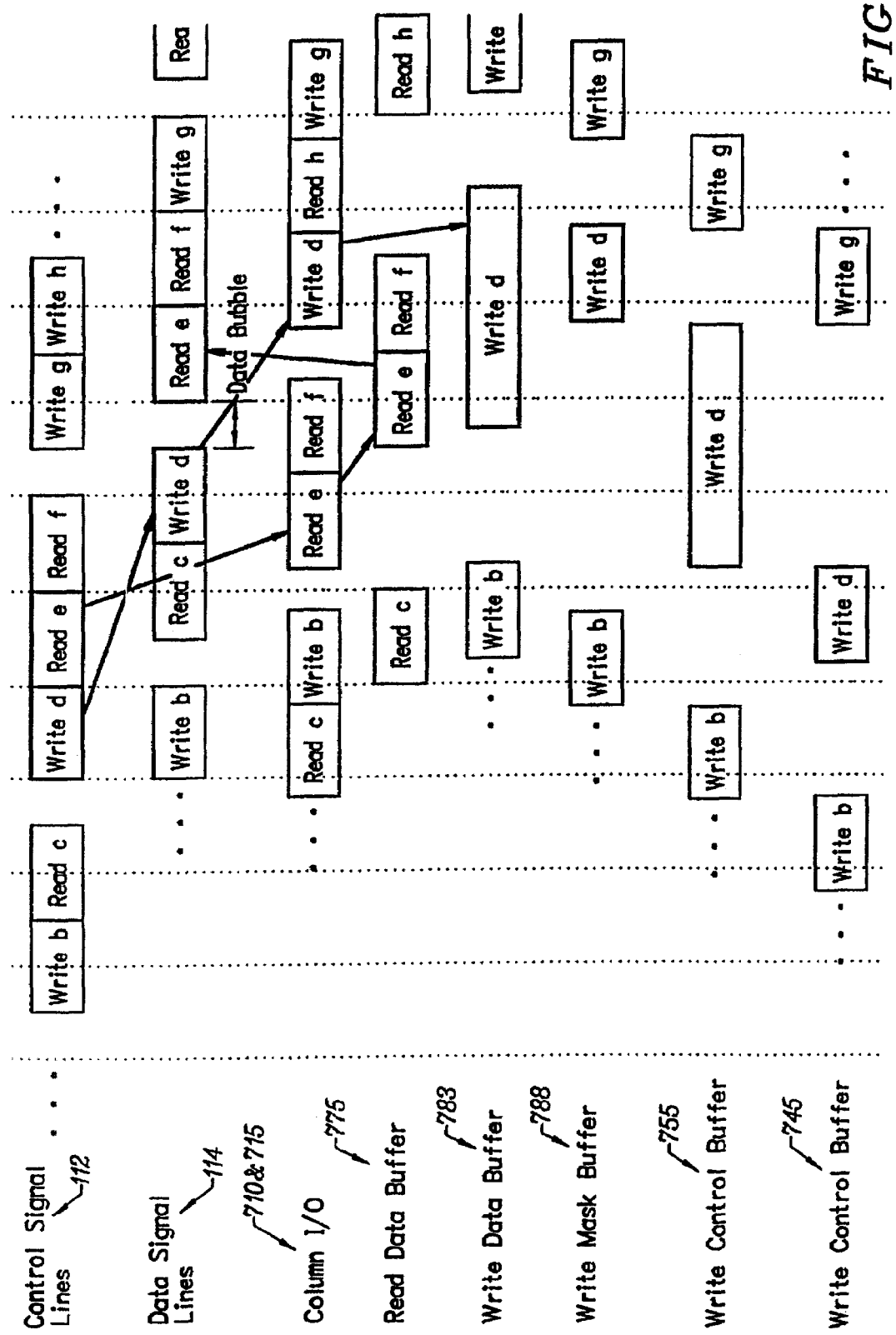
FIG. 14 is a timing diagram showing the reduction of the data bubble using the circuitry of FIG. 11 in a second case of a write operation followed by a read operation.

FIG. 12, FIG. 13 and FIG. 14 illustrate that the use of a reduced structure such as that shown in FIG. 11 is still capable of providing the benefits of the two-step write process. FIG. 12 is a timing diagram illustrating the segregated control and data signals from FIG. 11. FIG. 12 illustrates the use of a two-step write technique in the circuit of FIG. 11 (i.e., with one data buffer), in a situation where a write operation is abandoned in favor of a following read operation, to allow the read operation to complete prior to the write operation requiring the column resources of memory device 100.

FIG. 12 shows that the master unit issuing these read and write operations can abandon one of the write operations to perform the read. It should be noted that write "c" data is overwritten without a write operation being performed for it. In this embodiment, the master unit is assumed to have kept all the necessary information associated with the write operation stored at the master unit so that the write operation can be reissued. The control signals are sent via signals 700. The write data is sent to the memory device via signals 781, while the read data from memory device 100 is sent via signals 775. Write mask data is received via signals 786. In one embodiment, the data wires are not segregated so that read data and write data are transmitted on the same wires at different times (a bidirectional bus). In another embodiment, the data wires are further segregated so that some wires transmit only write data and other wires transmit only read data (a unidirectional bus). The write mask is sent over either the control wires or the data wires. In one embodiment, the write mask is sent using only the control signal lines. In another embodiment, the write mask is sent using only the data signal lines. In another embodiment, the write mask is sent on both control signal lines and the data signal lines.

The write operation labeled "a" in FIG. 12 shows the write control and the write data being transmitted at different times on control signal lines 112 and data signal lines 114, and used to operate memory 180 core with signals 710, 715, 783 and 788. After the arrival of the data, the application of control and data and mask signals to memory core 180 is done to complete the operation.

The highlighted write operation labeled "d" and its predecessor (write operation "c", which is the write operation that is abandoned) illustrate a different timing relationship. The operation of write operation "d" at memory core 100 via signals 710 and 715 is reordered to follow the read that the write precedes on control signal lines 112. This timing relationship is made possible by the separation of the control that signals the transport of the write data from the control that causes the write operation at the memory core, referred to as a retire operation. In one embodiment the retire control is a specific operation code as part of a control sequence. This is an example of an explicit retire command. In another embodiment, the retire control is implicitly indicated by the reception of any control that arrives when write data is arrived at 783 and any control is indicated that does not require a read operation to be performed. In another embodiment, the retire control is indicated when write data is arrived at wires 783 and either no further operation is signaled on control signal lines 112, or any control is indicated that does not require a read operation to be performed.

The highlighted read operation in FIG. 12 shows the read control being transmitted on control signal lines 112, which causes the memory core to be controlled by signals 710 and 715. The characteristics of memory core 180 affect the time at which the read data is available and delivered via signals 775, which are transmitted from the memory device on data signal lines 114.

The similar timing relationships for a read operation and a write operation, on control signal lines 112 and data signal lines 114, allow back-to-back operations for read and write. This may be performed when the operations are to different devices (as in the case illustrated in FIG. 3, 7 and 8), but also when the operations are to the same device, due to the reordering that the retire control allows.

In general, one control indicator is used to send the write data on data signal lines 114. A retire control indicator is used to perform the operation at the memory core. Additional control indicators may be used to signal any other control information for the write, such as the addresses or masks, as long as all the control information arrives in time for the memory operation indicated by the retire control indicator. The ability to generally perform back-to-back write and read operations allows high utilization of data signal lines 114 providing a high performance memory system.

The reordered writes of FIGS. 11, 12, 13, and 14 indicate that a loss of coherency may occur if the data read is from the same location as one of the writes that has been delayed. The structure indicated relies on the originator of the memory operations to maintain coherency. This may be done in many ways known to one skilled in the art. In one instance, if the read location corresponds to one of the write locations, the read operation is delayed until the corresponding write operation is retired. In another instance, a copy of the write data is maintained by the originator and is merged with the read information, or replaces the read operation.

FIG. 13 illustrates the use of a two-step write technique in the circuit of FIG. 11 (i.e., with one data buffer), in a situation where a read operation is delayed after a write stream, to allow the read operation to complete in the proper sequence with regard to the write operations requiring the column resources of memory device 100. FIG. 13 shows that a small bubble can be inserted to allow the write "c" data to be retired. This is done by inserting a "no-operation" (no-op) operation in the command stream on control signal lines 112. Write operation "d" is still reordered, and the bubble is smaller than it would be if not for the two step write. However, write "d" now has enough time to be stored in the retire buffer, again avoiding a conflict in the column resources of memory device 100.

Here again, write "d" is delayed to avoid the creation of a data bubble on interconnect 110. However, a no-op is inserted to delay the read so as to avoid a conflict on the column resources of memory device 100. By delaying the memory core's provision of the read data on the column resources, write "d" may be stored in the write data buffer, thus avoiding a conflict with the read operation. This allows a read operation to interrupt a stream of write operations without causing a conflict and without causing the data held in the write buffer to be overwritten. Those skilled in the art will appreciate that the "no-op" may be substituted with any operation that is not a read or write to memory device 100, including read or write operations to other memory devices.

FIG. 14 illustrates the use of a two-step write technique in the circuit of FIG. 11 (i.e., with one data buffer), in a situation where a read operation is issued with unstreamed write operations, to allow the read operation to complete in the proper sequence with regard to the write operations requiring the column resources of memory device 100. FIG. 14 shows that the dilemma of having a second reordered write overwriting another write operation will be avoided if the writes are not streamed. If the originator schedules the writes with enough separation for one operation, as either "no operation" (or "no-op") or a read, or a write to another device, then a read to this device can occur without any added delay, and without causing data to be overwritten in the one set of write data/mask buffers. Those skilled in the art will appreciate that a "no-op" can be substituted with any operation that does not involve a read or a write, such as a precharge operation.

FIGS. 15, 16, 17, and 18 illustrate an embodiment of a memory device according to the present invention in which the memory device also provides for coherency internally. This relieves the originator of the data and control signals (typically, a memory controller at the master) of having to keep track and maintain coherency in the operations the master unit had issued.

The concept here is that portions of the data needed to satisfy a read operation may exist in one of several places (e.g., one or both of the write buffers, and/or in memory core 180). Thus, a mechanism could be provided to allow data to exist in any one of those places and still be accessible to a read operation, assuming such operations are allowed in the architecture of memory device 100. This relieves the master unit (e.g., a memory controller) from having to keep track of where data is at any one time.

Figure 15:
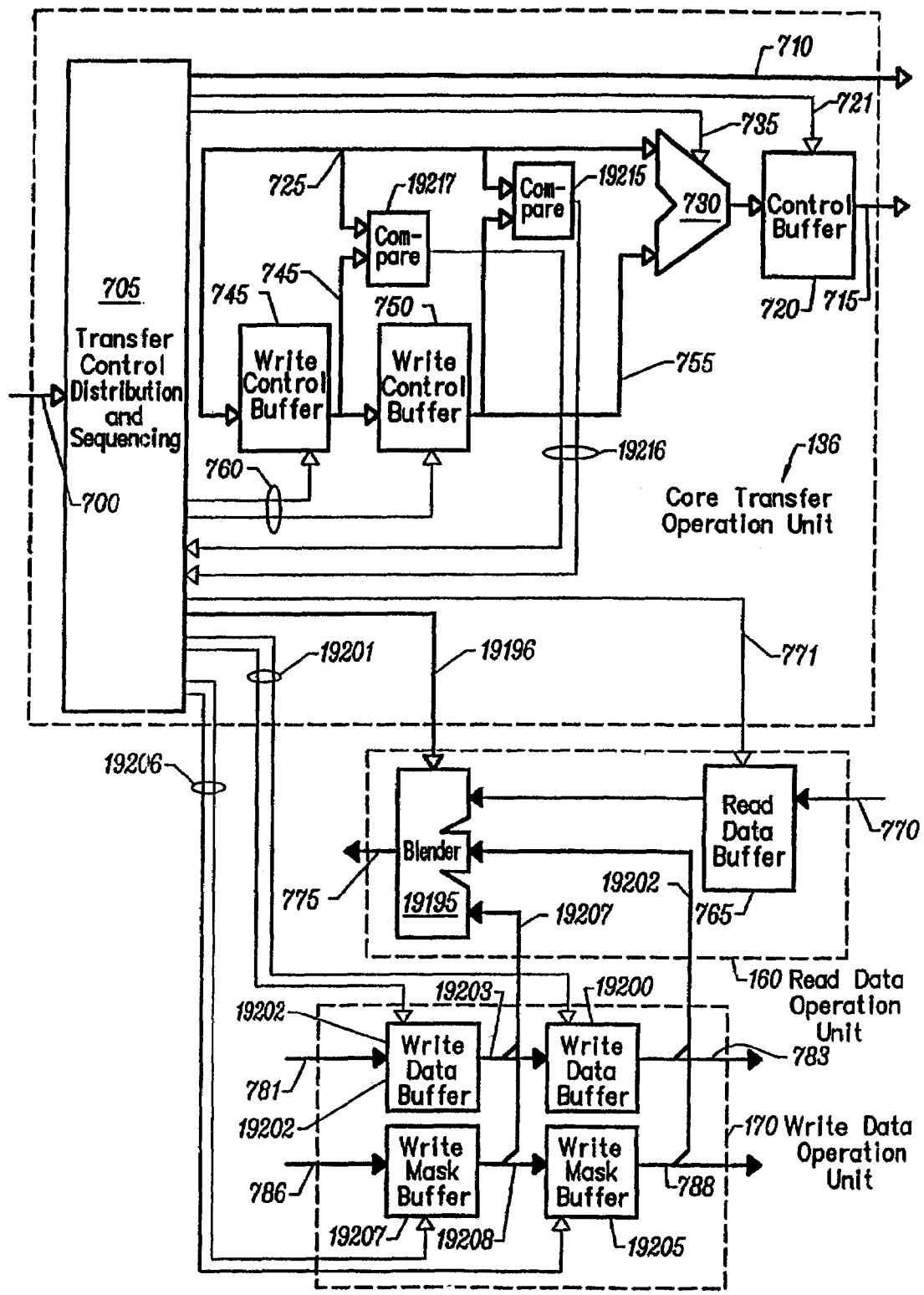
FIG. 15 is a block diagram of one embodiment of a memory device containing circuitry according to the present invention which provides for bypassing.

FIG. 15 shows the structure of FIG. 9 with the addition of comparators to compare an incoming read address with the two buffered write addresses. If a memory read address matches the address of one or both buffered writes, the additional circuitry in the data path below allows the merging of the read data with either or both of the buffered write data. If there is no mask, the merge is a simple multiplexer operation and the read need not be performed at memory core 180. In general, with a mask, the read does need to be performed and the data/mask combinations from the two buffered writes are used to update the read from memory core 180 to provide the latest information coherently.

Control signals 700 are received from the transport block 120. TCDS block 705, read data operation unit 160, and write operation unit 170 produce signals to control the memory core 180. Signals 710 are the control signals for the memory core and are preferably edge based. Signals 715 are signals that are presented to memory core 180 for a duration of time, and usually have setup and hold requirements with respect to the transition times of signals 710, and are produced by block 720. For a read operation, control buffer 720 receives control signals directly from block TCDS 705 via signals 725 through multiplexer 730, which is controlled by signal 735. For a write operation, control buffer 720 receives 10 control signals from TCDS block 705 via write control buffer 740, signals 745, write control buffer 750, signals 755 and multiplexer 730. Write buffers 740 and 750 are controlled by signals 760. For a write operation, signals 760 are timed to correspond to the arrival of the operation via signals 715.

The effect of write control buffer 740 and 750 is to delay the application of the operation control to the memory core. Another effect of write control buffers 740 and 750 is to allow storage of the write control information so that they may be passed on to the memory core for operation based on some later control indication, rather than just passing through on some fixed schedule. Other embodiments may use fewer or additional blocks to change the amount of the delay and storage.

Read data buffer 765 receives read data on signals 770 from the memory core 180, at times controlled by signal 771. The data is passed on to a blender 19195. Blender 19195 blends bits (or other quanta of data) to satisfy a read operation which may require data held in one of the write data buffers and/or memory core 180. The requisite data is then passed on to transport block 120 via signals 775. In another embodiment, read data buffer 765 is an amplifier capable of driving signals 19142, without the need for timing signal 771. In yet another embodiment, read data buffer 765 includes only interconnect. Other variations for read data operation unit 160 are possible, depending on specific drive and timing characteristics of the memory core.

Write data buffer 19202 receives write data from transport block 120 on signals 781 and is controlled by signal 19201. Write data buffer 19202 is an additional write data buffer, that is also controlled by signal 19201 so that it passes data through to write data buffer 19200 directly in some cases, but stores the data for later passing to write data buffer 19200 in other cases. The write data buffer 19200 receives write data from write data buffer 19202 via signals 19203, under the control of signal 19201, and presents the data to memory core 180 via signals 783. In an analogous fashion, mask data is passed using signals 786, 19208, and 788 with mask data being stored in write mask buffers 19207 and 19205. Mask data is used by memory core 180 to selectively write, or not write, parts of the data within the memory core.

In another embodiment, no mask is used so that all the data is written unconditionally.

By providing write data buffer 19200 (and write mask buffer 19205), memory device 100 allows write operations to be split into two operations, transport and retire. First, the write data (and mask) is transported to write data buffer 19200 (and write mask buffer 19205) using, for example, interconnect 110. Upon receiving a retire command (in whatever form), the write data is communicated to memory core 180. This allows write operations, which might otherwise be in contention for the column resources of memory device 100, to complete at a time when no conflicts exist with regard to the now-available column resources.

Additionally, the circuit of FIG. 15 permits data to be bypassed around memory core 180 in the case of a read requiring data held in write data buffers 19200 and 19202 (as indicated in part by write mask buffer 19205 and 19207). This is done by blender 19195 selecting signals 19203 and/or 19142, either in whole or in part using signals 19208 to account for masking of data 19203 (enabled by the bit-slice architecture of blender 19195). Data held in write data buffer 19200 may also be blended by using signals 783 (and signals 788 to account for masking of that data). Those skilled in the art will appreciate how to adapt the coherency mechanisms from FIG. 15 into the circuitry of FIG. 11 where there is only one data buffer.

Figure 16:
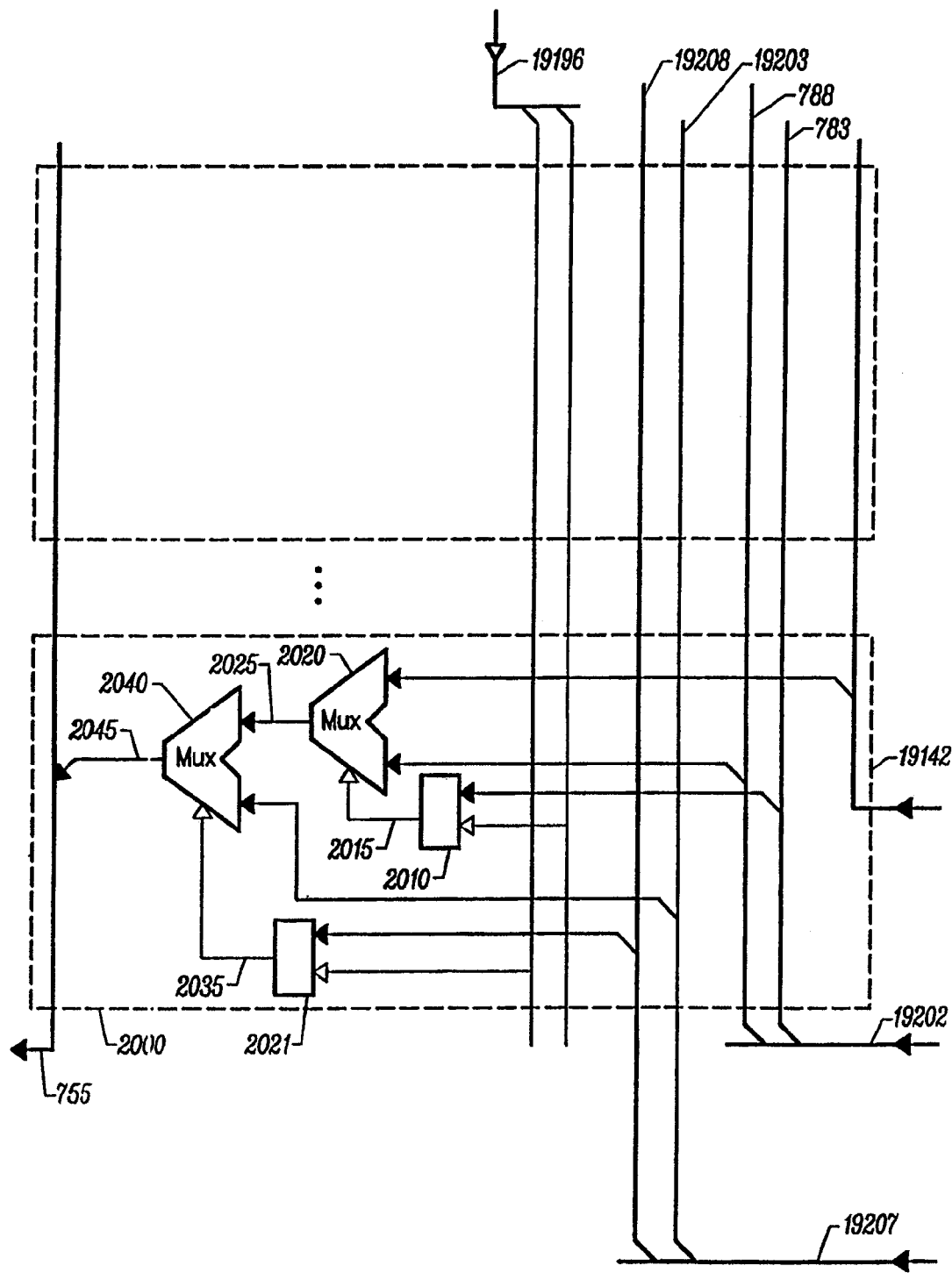
FIG. 16 is a block diagram of one embodiment of a blender, as illustrated in FIG. 15.

FIG. 16 shows an embodiment for a blender circuit. FIG. 16 illustrates the circuitry for a single bit in detail. The multiplexer combines the compare hit control information and the mask bit to select either the upstream data bit or substitute the bit from the write data buffer. The upstream multiplexer selects between the read operation data bit and the oldest write buffer data. The downstream multiplexer selects between the upstream multiplexer and the youngest write buffer data.

FIG. 16 illustrates a blender such as that shown in FIG. 15 as blender 19195. The function of this circuit to provide the necessary data to satisfy a read operation that requires data that is held in one or both of the write buffers and also possibly in memory core 180. The function performed by a blender of this type is to take data, portions of which may be masked, and portions of which may exist in various locations due to the architecture of a memory device implementing a 2-step write technique.

FIG. 16 shows a blender 2000 which comprises a multiplexer 2020 and a multiplexer 2040 which select data from various sources to combine the data in satisfying the data requirements of the read operation. Multiplexer 2020 selects between data from read data buffer 765 and data from write data buffer 19200. Information held in write mask buffer 19205 is combined with control signals from TCDS 705 by a circuit 2010. Alternatively, this can be seen as the bit of write data being conditioned by the write mask bit held in the write mask buffer when the addresses compare. The results of this combination selects the input of multiplexer 2020 by indicating the selection on a signal line 2015. The result of this selection is output on signal line 2025, which is input to multiplexer 2040.

Multiplexer 2040 selects between the output of multiplexer 2020 and the output of write data buffer 19202, again conditioned by the write mask information held in write mask buffer 19207 and address comparison. As shown in FIG. 16, the write mask information held in write mask buffer 19207 is actually combined with control signals from TCDS 705 by a circuit 2021, in the circuit shown in FIG. 16 (although numerous alternatives might easily be envisioned). The result of this operation causes multiplexer 2040 to select one of its inputs by indicating the desired selection on a signal line 2035. The output on signal line 2045 forms a part of output 755. As noted, blender 2000 represents only one bit-slice of a larger circuit. Thus, various portions of read data may come from various locations within memory device 100, and may also be made to depend on the value of a write mask and the results of address comparison.

Figure 17:
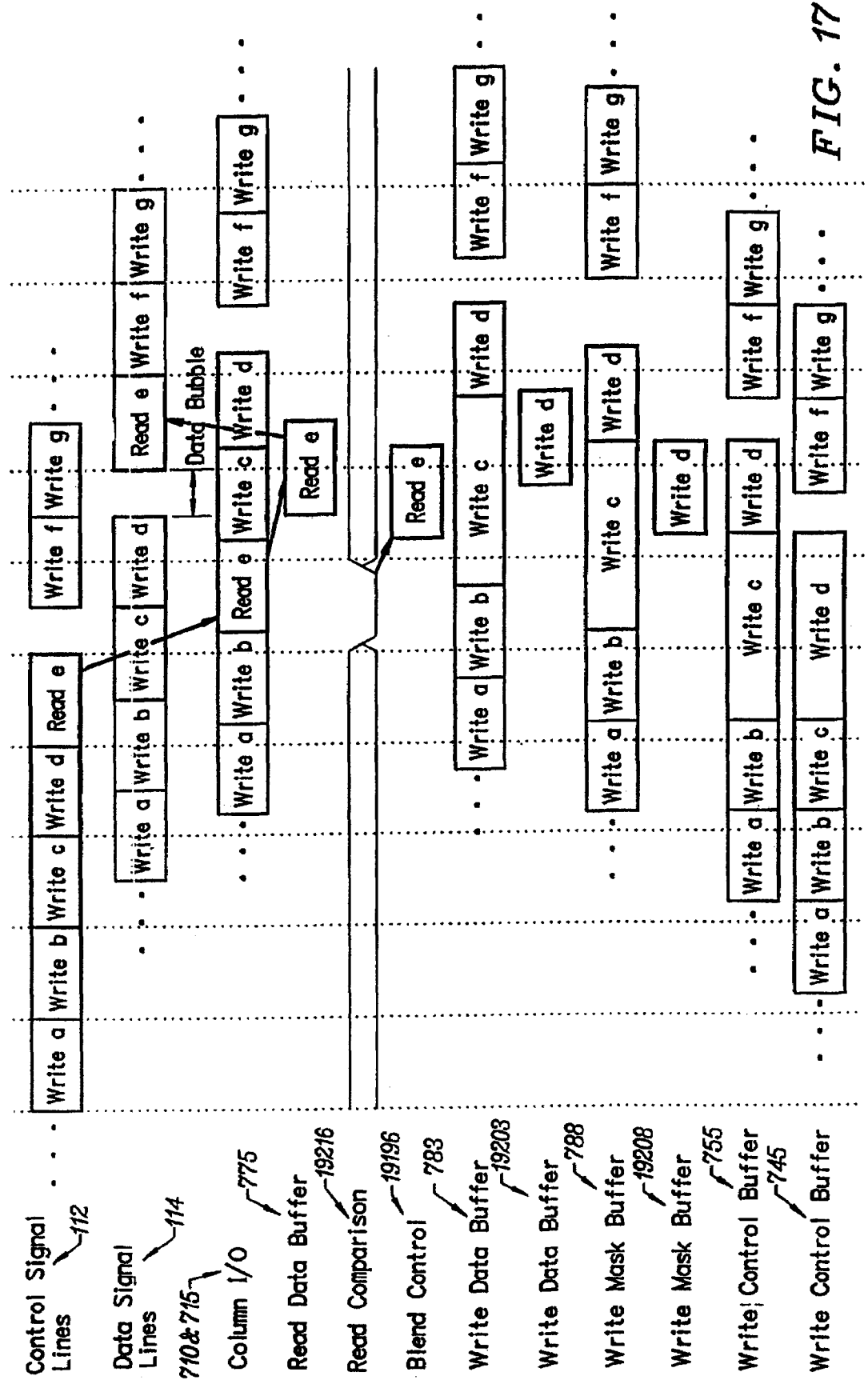
FIG. 17 is a timing diagram illustrating the operation of the circuitry of FIG. 15.

FIG. 17 is a timing diagram when neither write control buffer matches the incoming read. This is indicated as a low level on read comparison signal 19216. It can be seen that this timing diagram is substantially similar to the preceding timing diagrams (e.g., FIG. 10 and 12), with the exception that signals relating to the bypass operations are shown. These include read comparison signal 19216, which indicates a match of some or all of the data held in the write control buffers. Additionally, a read operation in such a system can be seen to require a small amount of extra time, allowing for the sequencing of comparison operations, and the potential blend of the read data and write buffers.

Figure 18:
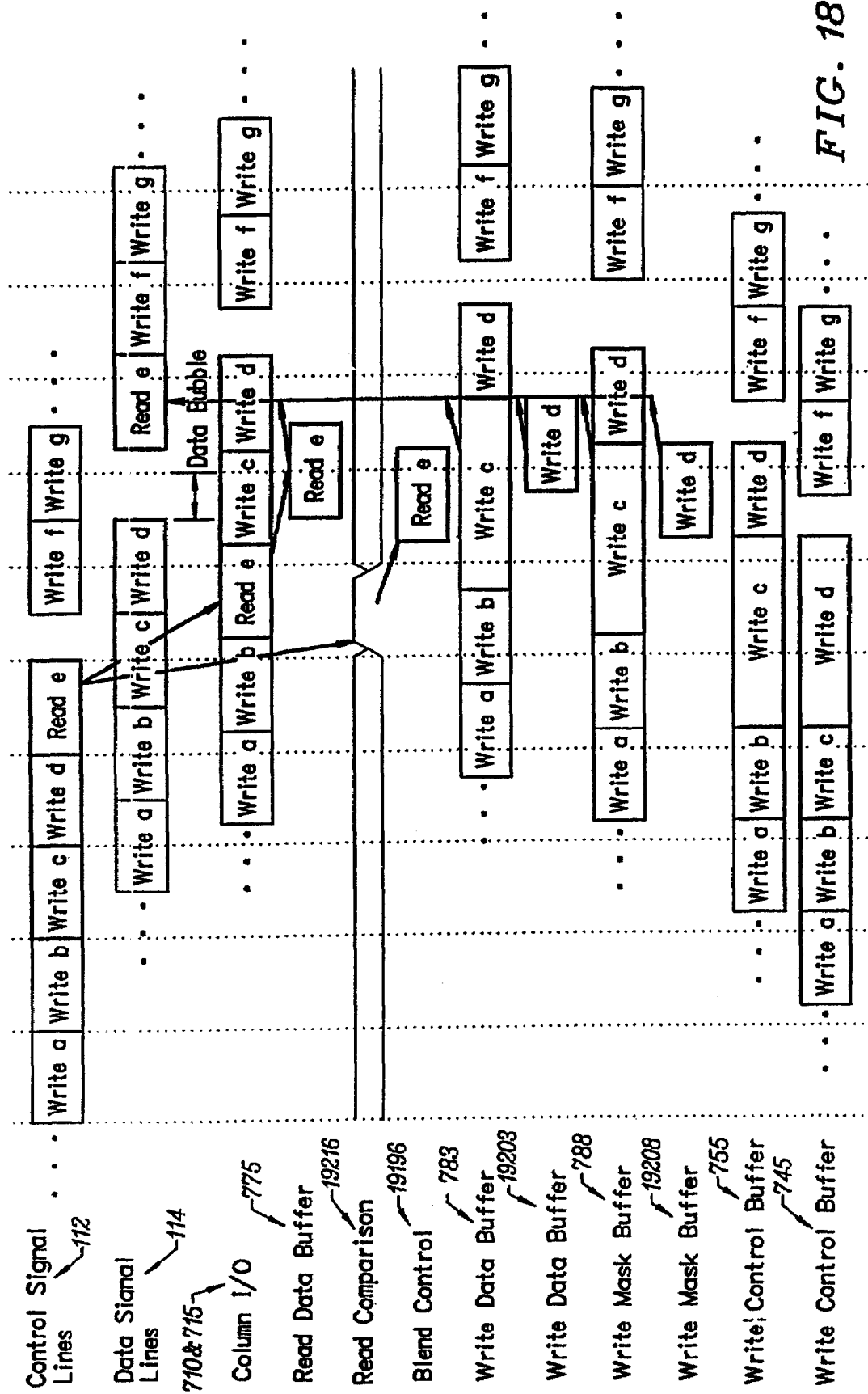
FIG. 18 is a timing diagram illustrating the operation of the circuitry of FIG. 15.

FIG. 18 is a timing diagram showing the new signals and the blending performed to produce a coherent read data transmission. In this timing diagram, the read address matches the addresses of write data held in both write data buffer 19200 and write data buffer 19202. This is indicated as a high level on read comparison signals 19216. In this example, data from memory core 180 (exemplified by the results of read operation as read "e"), write "d" (held in write data buffer 19202), and write "c" (held in write data buffer 19200).

IV. Variations on the Basic Two-Step Write Control Paradigm

In general, one control indicator is used to send the write data on data signal lines 114. A distinct retire control indicator is used to perform the operation at the memory core. Additional control indicators may be used to signal any other control information for the write, such as the addresses or masks, as long as all the control information arrives in time for the memory operation indicated by the retire control indicator.

As previously described, a two-step write comprises a transport and a retire step. The transport step communicates the data and a portion of the address and mask information. Some or all of the transport information is buffered in the memory device. The retire step communicates the balance of the address and mask information and causes the data to be written to the memory core, using whatever information may have been buffered from the transport step.

Thus, the mask information can be sent with the transport operation (or even before that point in time), with the retire operation, or as a separate operation, depending upon the system requirements. Indeed, these choices are applicable not only to write mask information, but to any of the control information that might need to be sent to memory device 100. Thus, these operations may occur at any time before the write retires.

In one embodiment, all of the address and mask information is transmitted with the transport step while the retire step indicates to the memory device that it is time for that buffered information to be written to the core. For example, all of the device, bank, and column addressing information plus the masking information can be sent in the transfer step, with the timing of the data transport associated with this step. In this embodiment, the retire step just provides memory core write timing.

In another embodiment, only the device address is provided with the transport step that sends data to the memory device. In this embodiment the remaining information, such as the bank and column address, as well as the mask information, are sent when the data is to be written into the memory core. Other alternative embodiments are possible. In these embodiments, different elements of information are associated with either the transport or retire steps. In one embodiment, device, bank, and column addressing information are associated with the transport step, while masking information is associated with the retire step. This association allows maximum commonality of operation arguments, such as addressing information, to occur between read and write operations while, as a second order constraint, minimizing the buffering, since reads do not use masking information.

In addition to the variations discussed above, the retire step can be either explicit or implicit. An explicit retire requires that an operation code or some means of coding that is discrete from the other operations in the packet, such as an independent bit, be provided for, and supplied to the memory device when it is time for the retire to occur. In addition to the means of indicating that the operation is to be performed there must also be a means to indicate which buffered information is to be retired. For example, this may be by means of a device address. However, other methods are possible, for example, each device could keep track of how many transports have occurred but have not been retired prior to a transport directed to it. A first-in-first-out (FIFO) policy might be implemented, in which case the device can do a retire at an appropriate time of its own choosing, without an explicit device address being needed.

An implicit retire presumes that the memory device can determine when it can perform the write of the buffered information to the memory core without an explicit instruction to do so. There are many methods to do this. For example:

If no transfer operation is directed to the memory device, it autonomously does a column write operation.

When the memory device detects that an alternative operation is taking place that cannot require the column I/O resource then it performs the column write operation.

If the retire is done autonomously, this eliminates the high level of control over resource consumption by the master unit (i.e., a memory controller). In some embodiments, it is desirable for the master unit to have a high level of control over resource consumption. This is because once the write information has been placed into the memory device, the memory device may proceed to use the column I/O resource at its discretion. If the master unit does not keep the column I/O resource busy, then the resource's usage will be triggered by the memory device, even if the master unit would prefer to use the column I/O resource before the resource goes idle again.

If the retire is triggered by an alternative operation, this allows the controller to continue to exert control over the timing of the memory core write operation, without having to explicitly allocate control bandwidth to do so. This method may be implemented in several ways. In one embodiment, the memory device performs a retire operation whenever:

control information is received, and the retire buffer is not empty (both control and data), and the control is read or write control and control information is either directed to a different column I/O path, or directed to the same column I/O path but is not a read operation the control is not read or write control Presuming that the transfer control information can arrive no faster than any column I/O path can perform a single transfer cycle it is impossible for a resource conflict to occur given the rules above.

Another modification is varying the number of retire buffers employed. As noted, to avoid resource conflicts with the bidirectional column I/O bus in the core, the write operation may be divided into two (or more) steps. The write control information may include, for example, device, bank and column address and write mask. In one embodiment, the retire buffer stores write data and transport write control information until the retire command is issued and holds the write data valid long enough to meet the hold time requirements of the core interface. The actual write command signals to start the write operation are issued after the control logic receives the retire command. The depth of the retire buffers can be one or greater. A deeper retire buffer can eliminate loss due to certain read-write combinations that otherwise introduce performance bubbles in the pipeline, but do so at the cost of increased hardware and complexity.

The method of the present invention is not intended to be limited by the preceding statements. A person of ordinary skill in the art will realize that different circuitry can be used and alterations can be made to the protocol of the present invention without departing from the spirit of the invention. Other equivalent or alternative protocols and apparatus according to the present invention will be apparent to those skilled in the art. For example, any number of retire buffers may be employed, allowing any amount of write data to be delayed, to account for resource conflicts at any point in the datapath of memory device 100. These equivalents and alternatives are intended to be included within the scope of the present invention.

What is claimed is:

1. A memory device comprising:
    a memory core including an array of memory cells;
    a first circuit to receive a write command from external control lines, wherein the write command specifies a write operation;
    a second circuit coupled to the first circuit, the second circuit to store the write command for a first time period after the write command is received at the first circuit, wherein the write command initiates a write operation after the first time period has transpired; and
    a third circuit to receive data from external data lines after a second time period transpires from when the write command is received at the first circuit, wherein the data is stored in the memory core in response to the write command.

2. The memory device of claim 1, wherein the second circuit comprises a first buffer stage to receive the write command from the first circuit, the first buffer stage to control storage of the write command in response to a first control signal.

3. The memory device of claim 2, wherein the second circuit comprises a second buffer stage to receive the write command from the first buffer stage, the second buffer stage to control storage of the write command in response to a second control signal.

4. The memory device of claim 1, further comprising a fourth circuit to receive mask information from external mask lines, the mask information indicating whether to mask portions of the data to be stored in the memory core.

5. The memory device of claim 4, further comprising a fifth circuit to receive the data from the third circuit, to store the received data, and to present the received data to the memory core.

6. The memory device of claim 5, further comprising a sixth circuit to receive the mask information from the fourth circuit, to store the mask information, and to provide the mask information to the memory core.

7. The memory device of claim 1, wherein the memory cells are dynamic random access memory cells.

8. A memory device comprising:
a memory core including an array of dynamic random access memory cells;
a transport block to receive a write command from external control lines, wherein the write command specifies a write operation;
a write control buffer coupled to the transport block, the write control buffer to store the write command for a first time period after the write command is received at the transport block, wherein the write command initiates the write operation after the first time period has transpired; and
a data buffer to receive data from external data lines after a second time period transpires from when the write command is received at the transport block, wherein the data is stored in the memory core in response to the write command.

9. The memory device of claim 8, further comprising a mask buffer to receive mask information from external mask lines, the mask information indicating whether to mask portions of the data to be stored in the memory core.

10. The memory device of claim 8, wherein the memory cells are dynamic random access memory cells.

11. A memory device comprising:
a memory core including an array of memory cells;
a first circuit to receive a write command from external control lines, wherein the write command specifies a write operation;
a second circuit coupled to the first circuit, the second circuit to store the write command for a first time period after the write command is received at the first circuit, wherein the write command initiates a write operation after the first time period has transpired;
a third circuit to receive data from external data lines, wherein the data is stored in the memory core in response to the write command; and
a fourth circuit to receive mask information from external mask lines, the mask information indicating whether to mask portions of the data to be stored in the memory core.

12. The memory device of claim 11, further comprising a fifth circuit to receive the data from the third circuit, to store the received data, and to present the received data to the memory core.

13. The memory device of claim 12, further comprising a sixth circuit to receive the mask information from the fourth circuit, to store the mask information, and to provide the mask information to the memory core.

14. The memory device of claim 11, wherein the memory cells are dynamic random access memory cells.

15. A memory device comprising:
a memory core including an array of dynamic random access memory cells;
a transport block to receive a write command from external control lines, wherein the write command specifies a write operation;
a write control buffer coupled to the transport block, the write control buffer to store the write command for a first time period after the write command is received at the transport block, wherein the write command initiates the write operation after the first time period has transpired;
a data buffer to receive data from external data lines, wherein the data is stored in the memory core in response to the write command; and
a write mask buffer to receive mask information from external mask lines, the mask information indicating whether to mask portions of the data to be stored in the memory core.

16. The memory device of claim 15, wherein the write control buffer comprises a first write control buffer stage and a second write control buffer stage to receive the write command from the first buffer stage in response to a control signal.

17. The memory device of claim 15, wherein the data buffer comprises a first data buffer stage to receive the data from the external data lines and a second data buffer stage to receive the data from the first data buffer stage and to provide the data to the memory core.

18. The memory device of claim 17, wherein the write mask buffer comprises a first mask buffer stage to receive the mask information from the external data lines and a second mask buffer stage to receive the mask information from the first mask buffer stage and to provide the data to the memory core.

19. A method of operation in a single chip memory device, the method comprising:
receiving a write command from control signal lines that are external to the memory device, wherein the write command specifies a write operation;
storing the write command for a first time period after receiving the write command;
receiving, after a second time period has transpired from receiving the write command, data from data signal lines that are external to the memory device;
after the first time period, initiating the write operation in response to the write command; and
writing the data to a memory core of the memory device during the write operation.

20. The method of claim 19, further comprising receiving mask information that indicates whether to mask portions of the data while writing the data to the memory core during the write operation.

21. The method of claim 19, further comprising:
holding the data in a write buffer after receiving the data; and
receiving a retire command that indicates releasing the data from the write buffer for the writing to the memory core during the write operation.

22. The method of claim 19, wherein storing the write command comprises buffering the write command through a plurality of buffer stages during the first time period.

23. The method of claim 19, further comprising:
receiving a read command that specifies a read operation;
applying the read command to the memory core to service the read operation; and
outputting data corresponding to the read command, wherein the time period from receiving the read command to outputting the read data is a channel turnaround time less than the first time period.

24. The method of claim 19, further comprising,
after receiving the data, storing the data in a write buffer until the first time period expires; and after the first time period transpires, releasing the data from the write buffer for the writing to the memory core during the write operation.

25. A method of operating a memory device having a memory core, the method comprising:
providing a write command that specifies a write operation to the memory device, wherein, after receiving the write command the memory device stores the write command for a first time period before initiating the write operation in response to the write command;
providing data to the memory device after a second time period has transpired after providing the write command, wherein the memory device stores the data in the memory core during the write operation.

26. The method of claim 25, further providing mask information to the memory device, the mask information indicating whether to mask portions of the data while writing the data to the memory core during the write operation.

27. The method of claim 26, wherein the mask information is provided to the memory device before the data is provided to the memory device.

28. The method of claim 25, including storing the data in a write buffer of the memory device after receiving the data, and further comprising providing a retire command to the memory device, wherein the retire command indicates releasing the data from a write buffer for the writing to the memory core during the write operation.

29. The method of claim 25, further comprising:
providing a read command to the memory device, wherein the read command specifies a read operation; and
the memory device outputting data corresponding to the read command, wherein the time period from receiving the read command to outputting the read data is a channel turnaround time less than the first time period.

* * * * *